United States Patent
Shibata et al.

(10) Patent No.: US 9,627,973 B2
(45) Date of Patent: Apr. 18, 2017

(54) SWITCHING POWER SUPPLY DEVICE, AND INVERTER, CONVERTER, AND SOLAR POWER CONTROLLER INCLUDING SAME

(71) Applicant: Sharp Kabushiki Kaisha, Osaka-shi, Osaka (JP)

(72) Inventors: Akihide Shibata, Osaka (JP); Shuji Wakaiki, Osaka (JP); Kohtaroh Kataoka, Osaka (JP); Takeshi Shiomi, Osaka (JP); Hiroki Igarashi, Osaka (JP); Hiroshi Iwata, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 48 days.

(21) Appl. No.: 14/889,008

(22) PCT Filed: Mar. 14, 2014

(86) PCT No.: PCT/JP2014/056974
§ 371 (c)(1),
(2) Date: Nov. 4, 2015

(87) PCT Pub. No.: WO2014/185143
PCT Pub. Date: Nov. 20, 2014

(65) Prior Publication Data
US 2016/0156267 A1 Jun. 2, 2016

(30) Foreign Application Priority Data
May 14, 2013 (JP) .................................. 2013-102483

(51) Int. Cl.
*H02M 1/15* (2006.01)
*H02M 3/335* (2006.01)
(Continued)

(52) U.S. Cl.
CPC ............. *H02M 3/158* (2013.01); *H02M 7/44* (2013.01); *H02M 7/5387* (2013.01);
(Continued)

(58) Field of Classification Search
CPC ... H02M 3/142; H02M 3/158; H02M 3/33569
(Continued)

(56) References Cited

U.S. PATENT DOCUMENTS

| 7,675,276 B2 * | 3/2010 | Ohkawa ............... H02M 3/1588 323/271 |
| 2006/0091871 A1 * | 5/2006 | Abedinpour .......... H02M 3/158 323/283 |

(Continued)

FOREIGN PATENT DOCUMENTS

| JP | 7-264876 A | 10/1995 |
| JP | 2003-319638 A | 11/2003 |

(Continued)

OTHER PUBLICATIONS

Official Communication issued in International Patent Application No. PCT/JP2014/056974, mailed on May 27, 2014.

*Primary Examiner* — Jeffrey Sterrett
(74) *Attorney, Agent, or Firm* — Keating & Bennett, LLP

(57) ABSTRACT

A highly efficient and low-cost switching power supply device includes a high withstand voltage transistor and a low withstand voltage transistor. When current flows from a second node to a first node, the high withstand voltage transistor turns on and the low withstand voltage transistor turns off, causing current to flow through a built-in diode of the low withstand voltage transistor. Since current does not flow through the parasitic diode of the high withstand voltage transistor, the recovery current is reduced. Furthermore, since a first delay circuit including resistors and a diode is connected to the gate electrode of the high withstand (Continued)

voltage transistor, and a second delay circuit including resistors and a diode is connected to the gate electrode of the low withstand voltage transistor, precise adjustment of the switching speed during switching operation is possible, and losses are reduced.

8 Claims, 8 Drawing Sheets

(51) Int. Cl.
*H02M 3/158* (2006.01)
*H02M 7/5387* (2007.01)
*H03K 17/16* (2006.01)
*H03K 17/687* (2006.01)
*H02M 7/44* (2006.01)
*H02M 1/08* (2006.01)
*H02J 3/38* (2006.01)
*H02M 1/00* (2006.01)
*H03K 17/74* (2006.01)

(52) U.S. Cl.
CPC ....... *H03K 17/163* (2013.01); *H03K 17/6871* (2013.01); *H02J 3/383* (2013.01); *H02M 1/08* (2013.01); *H02M 2001/0054* (2013.01); *H03K 17/74* (2013.01); *H03K 2217/0036* (2013.01); *Y02B 70/1491* (2013.01); *Y02E 10/563* (2013.01)

(58) Field of Classification Search
USPC .......................................................... 323/271
See application file for complete search history.

(56) References Cited

U.S. PATENT DOCUMENTS

| | | | |
|---|---|---|---|
| 2008/0278125 A1* | 11/2008 | Pigott | H02M 1/38 323/271 |
| 2013/0083580 A1 | 4/2013 | Komiya et al. | |
| 2015/0008891 A1* | 1/2015 | Li | H02M 3/158 323/271 |
| 2015/0214841 A1* | 7/2015 | Ramorini | H02M 3/158 323/271 |
| 2015/0214844 A1* | 7/2015 | Kyono | H02M 3/33507 363/21.02 |
| 2015/0256074 A1* | 9/2015 | Biondi | H02M 1/38 323/271 |
| 2015/0349640 A1* | 12/2015 | Ito | H02M 3/158 323/271 |
| 2016/0156267 A1* | 6/2016 | Shibata | H03K 17/163 363/131 |

FOREIGN PATENT DOCUMENTS

| | | |
|---|---|---|
| JP | 2010-29019 A | 2/2010 |
| JP | 2013-85448 A | 5/2013 |

* cited by examiner

SWITCHING POWER SUPPLY DEVICE, AND INVERTER, CONVERTER, AND SOLAR POWER CONTROLLER INCLUDING SAME

TECHNICAL FIELD

The present invention relates to a switching power supply device, and more particularly, to a switching power supply device with low switching loss, and to an inverter, a converter, and a solar power controller including the same.

BACKGROUND ART

In the past, there have been cases in which a metal-oxide-semiconductor (MOS) transistor parasitic diode is used as a freewheeling diode in an inverter. In such cases, if a power supply voltage is applied in the reverse direction to the parasitic diode while an electrical current is flowing back in the forward direction to the parasitic diode, recovery current (reverse recovery current) flows to the parasitic diode, generating a large switching loss.

Japanese Unexamined Patent Application Publication No. H7-264876 discloses a method of preventing flow of recovery current by connecting a backflow prevention diode in the forward direction between a node on the high-voltage side and the drain of the MOS transistor, as well as connecting a freewheeling diode in the forward direction between the source of the MOS transistor and a node on the high-voltage side.

Also, Japanese Unexamined Patent Application Publication No. 2010-29019 discloses a method of preventing flow of recovery current by connecting two MOS transistors in series between a node on the high-voltage side and a node on the low-voltage side, and connecting a freewheeling diode having a high withstand voltage in the forward direction between a node on the low-voltage side and a node on the high-voltage side.

However, there is a problem with the method of Japanese Unexamined Patent Application Publication No. H7-264876, in that conduction loss is generated in the backflow prevention diode. There is also a problem with the method of Japanese Unexamined Patent Application Publication No. 2010-29019, in that costs become high as a result of providing two MOS transistors and a freewheeling diode having a high withstand voltage.

Accordingly, preferred embodiments of the present invention provide a highly efficient, low-cost switching power supply device, and an inverter, a converter, and a solar power controller including the same.

A switching power supply device according to a preferred embodiment of the present invention includes: a first transistor including a first electrode connected to a first node; and a second transistor including a first electrode connected to a second electrode of the first transistor, and a second electrode connected to a second node, wherein each of the first and second transistors includes a parasitic diode connected in a forward direction between the second and first electrodes, and a withstand voltage between the first and second electrodes of the first transistor is higher than a withstand voltage between the first and second electrodes of the second transistor. Additionally provided is a driving circuit that turns on the first and second transistors when a current flows from the first node to the second node, and turns on the first transistor while also turning off the second transistor when a current flows from the second node to the first node. The driving circuit turns on the first transistor by applying to a control electrode of the first transistor a voltage that is higher than a voltage obtained by adding a threshold voltage of the first transistor to a voltage of the second node. A first delay circuit that delays a potential variation of a control electrode of the first transistor and a second delay circuit that delays a potential variation of a control electrode of the second transistor are connected to the control electrode of the first transistor and the control electrode of the second transistor, respectively, and at least one of the first delay circuit and the second delay circuit includes a structure that causes a potential of the control electrode of the first transistor or the control electrode of the second transistor to be increased at a first speed and decreased at a second speed that is different from the first speed.

According to a preferred embodiment of the present invention, in a second transistor having a low withstand voltage compared to a first transistor having a high withstand voltage, a recovery current caused by a built-in diode is small. Subsequently, when current flows from a second node to a first node, the first transistor turns on and the second transistor turns off, and thus a current flows only to the built-in diode of the second transistor having a small recovery current, without a current flowing to the built-in diode of the first transistor having a large recovery current. Consequently, the built-in diodes of the transistors preferably are utilized without externally attaching a freewheeling diode, and losses due to recovery current are reduced. As a result, a highly efficient and low-cost switching power supply device is provided.

Also, according to a preferred embodiment of the present invention, the first transistor having a high withstand voltage and the second transistor having a low withstand voltage are connected in series, and the second transistor having a low withstand voltage performs the switching operation. Since the majority of the power supply voltage is applied between a first electrode and a second electrode of the first transistor having a high withstand voltage, the voltage between a first electrode and a second electrode of the second transistor having a low withstand voltage that performs the switching operation is able to be small. For this reason, the degree of influence on the electric potential of the control electrode of the second transistor that performs the switching operation exerted due to variation in the electric potential of the capacitively coupled first electrode is able to be small. As a result, misfiring of the second transistor due to variation in the electric potential of the control electrode is effectively reduced or prevented. Consequently, a highly reliable switching power supply device is provided.

Also, according to a preferred embodiment of the present invention, in at least one of either the first or the second transistor, it is possible to decide independently the speeds at which the electric potential of the control electrode increases and decreases. Consequently, since the rising and falling speeds of switching is able to be decided independently, more precise switching of the circuit is able to be sped up within a range in which the circuit does not oscillate, and losses are significantly reduced or eliminated.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

First Preferred Embodiment

Figure 1:
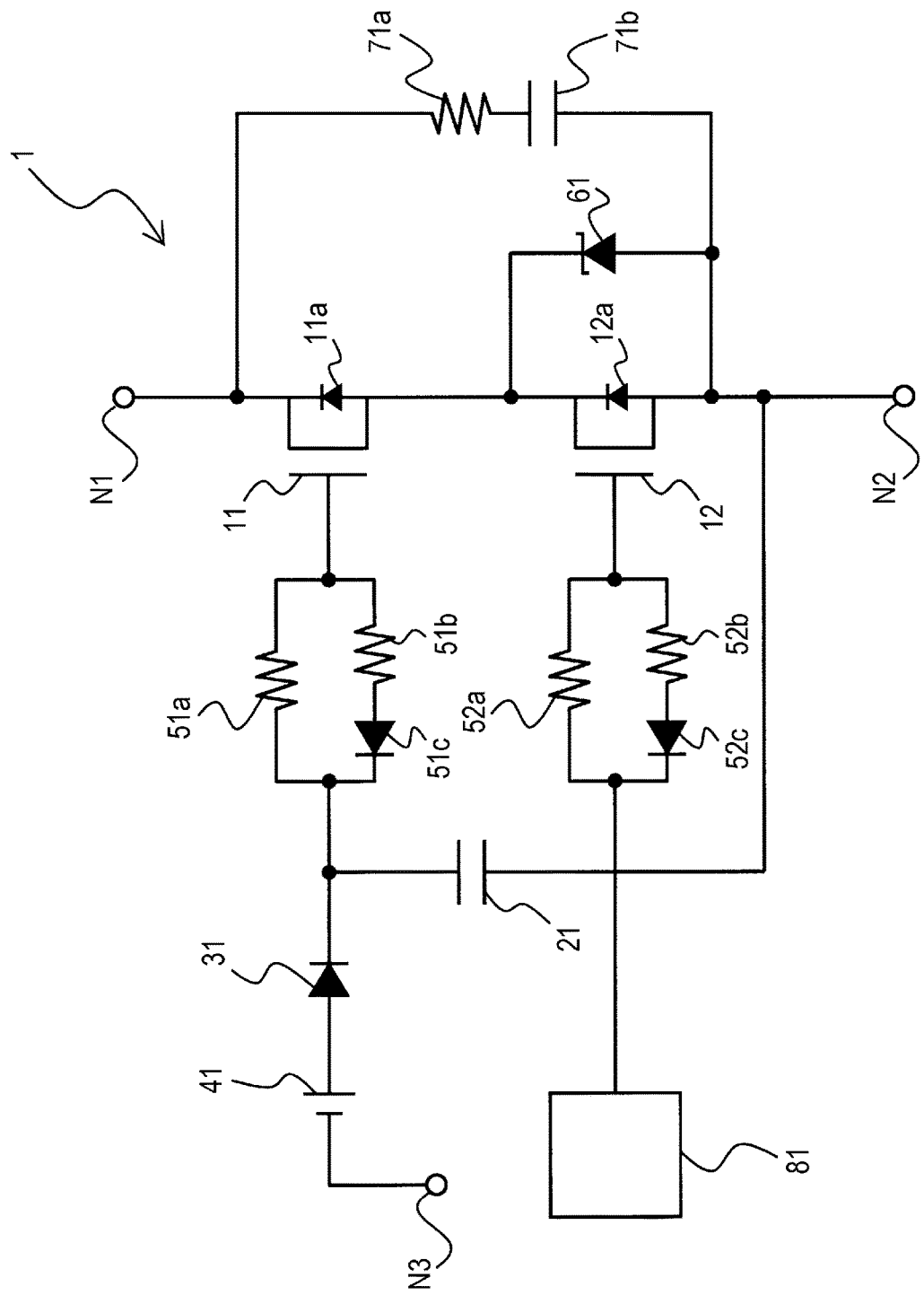
FIG. 1 is a circuit block diagram illustrating a configuration of a switching power supply device according to a first preferred embodiment of the present invention.

As illustrated in FIG. 1, a switching power supply device 1 according to a first preferred embodiment of the present invention includes n-channel MOS transistors 11 and 12, capacitors 21 and 71b, diodes 31, 51c, and 52c, a gate power supply 41, resistors 51a, 51b, 52a, 52b, and 71a, a Zener diode 61, and a gate driver 81. The transistors 11 and 12 have built-in parasitic diodes 11a and 12a, respectively.

An anode of each of the parasitic diodes 11a and 12a is connected to a source (second electrode) of the corresponding transistor 11 (first transistor) and transistor 12 (second transistor), respectively, while a cathode of each of the parasitic diodes 11a and 12a is connected to a drain (first electrode) of the corresponding transistors 11 and 12, respectively.

The transistor 11 is a high withstand voltage transistor, having a source-drain withstand voltage of 600 V, for example. The transistor 12 is a low withstand voltage transistor, having a source-drain withstand voltage of 30 V, for example, lower than a source-drain withstand voltage of the first transistor 11. Generally, a recovery current of the low withstand voltage transistor 12 is smaller than a recovery current of the high withstand voltage transistor 11. The parasitic diode 12a of the low withstand voltage transistor 12 operates as a freewheeling diode.

Note that as a distance between the source and drain of a transistor becomes longer, the source-drain withstand voltage of the transistor becomes higher. Also, as a channel impurity concentration of a transistor becomes lower, the source-drain withstand voltage of the transistor becomes higher. Also, as an impurity concentration in the parasitic diode rises, a minority carrier lifetime becomes shorter, and a recovery current becomes smaller. Since the impurity concentration of the low withstand voltage transistor 12 is higher than the impurity concentration of the high withstand voltage transistor 11, the recovery current of the low withstand voltage transistor 12 is smaller than the recovery current of the high withstand voltage transistor 11.

Note that the source-drain withstand voltage of the low withstand voltage transistor 12 is preferably within a range from 3 V to 200 V. If the source-drain withstand voltage of the low withstand voltage transistor 12 exceeds 200 V, the recovery current in the low withstand voltage transistor 12 increases. Also, when the source-drain withstand voltage of the low withstand voltage transistor 12 is less than 3 V, the low withstand voltage transistor 12 becomes less tolerant against noise in the power supply circuit.

Also, the source-drain withstand voltage of the high withstand voltage transistor 11 is preferably within a range from 3 times or more to 100 times or less than the source-drain withstand voltage of the low withstand voltage transistor 12. When the source-drain withstand voltage of the high withstand voltage transistor 11 is less than 3 times the source-drain withstand voltage of the low withstand voltage transistor 12, a difference between the recovery current of the high withstand voltage transistor and the recovery current of the low withstand voltage transistor becomes smaller, and advantageous effects of the first preferred embodiment are lessened. Also, when the source-drain withstand voltage of the high withstand voltage transistor 11 is greater than 100 times the source-drain withstand voltage of the low withstand voltage transistor 12, the low withstand voltage transistor becomes less tolerant against switching noise.

A drain of the transistor 11 is connected to a first node N1. A drain of the transistor 12 is connected to the source of the transistor 11, and the source of the transistor 12 is connected to a second node N2.

A resistor 51a (first resistor), a resistor 51b (second resistor), and a diode 51c constitute a first delay circuit. The resistor 51b and the diode 51c are connected in series. The resistor 51a is additionally connected in parallel to the resistor 51b and the diode 51c connected in series, thereby forming the first delay circuit. A first terminal of the first delay circuit is connected to a gate (control electrode) of the transistor 11.

A resistor 52a (first resistor), a resistor 52b (second resistor), and a diode 52c constitute a second delay circuit. The resistor 52b and the diode 52c are connected in series. The resistor 52a is additionally connected in parallel to the resistor 52b and the diode 52c connected in series, thereby forming the second delay circuit. A first terminal of the second delay circuit is connected to a gate (control electrode) of the transistor 12.

When current flows from the other-terminal side of the first and second delay circuits to a first-terminal side (the side connected to the transistors 11 and 12), a resistance of the first and second delay circuits is prescribed by a resistance of the resistors 51a and 52a, respectively. On the other hand, when current flows from the first-terminal side of the first and second delay circuits to the other-terminal side, the resistance of the delay circuits is prescribed by a combined resistance from a parallel connection of the resistor 51a and the resistor 51b, and a combined resistance from a parallel connection of the resistor 52a and the resistor 52b, respectively. Consequently, a respective resistances of the parallel connection of the resistor 51a and the resistor 51b and the parallel connection of the resistor 52a and the resistor 52b are related to a time constant when a gate potential of the high withstand voltage transistor 11 is increased or decreased, and the time constant when the gate potential of the low withstand voltage transistor 12 is increased or decreased, respectively. More specifically, an integral of the each resistance above and a gate capacitance of the transistor associated with a relevant resistance has a time dimension, and becomes a time constant when a gate potential transitions.

In a configuration of the first and second delay circuits illustrated in FIG. 1, as long as the resistors 51a and 52a have non-zero resistance, a time constant when decreasing a gate potential of the transistors 11 and 12 becomes less than the time constant when increasing the gate potential of the transistors 11 and 12. However, if the diodes 51c and 52c are connected with a polarity reversed, it is possible to make the time constant when decreasing the gate potential of the transistors 11 and 12 be greater than the time constant when increasing the gate potential of the transistors 11 and 12. In either of the above cases, speeds at which the gate potential of the transistors 11 and 12 is increased and decreased differ from each other.

From the above, in the configuration illustrated in FIG. 1, by adjusting the respective resistances of the four resistors 51a, 51b, 52a, and 52b, it is possible to decide independently the speeds at which the gate potential of each of the transistors 11 and 12 is increased.

Note that one of the first delay circuit and the second delay circuit may also be a delay circuit that includes only one resistor. For example, in a case in which the first delay circuit includes only one resistor while the second delay circuit is as illustrated in FIG. 1, speeds at which the gate potential of the transistor 11 is increased and decreased are not able to be decided independently, but the speeds at which the gate potential of the transistor 12 is increased and decreased are able to be decided independently. Preferably, however, both the first and second delay circuits include additionally connecting a resistor in parallel to a resistor and a diode connected in series, as illustrated in FIG. 1. This is because, in this case, it is possible to decide independently the speeds at which the gate potential of each of the transistors 11 and 12 is increased and decreased.

Rapidly varying the gate potential of the transistors 11 and 12 is effective at reducing switching losses, but also produces a side-effect of a circuit oscillating more readily. By deciding independently the speeds at which the gate potential of the transistors 11 and 12 is increased and decreased, the circuit is switched more rapidly within a range of the circuit not oscillating, and losses are significantly reduced or prevented.

A resistance of the resistor 51a is able to be set from 1Ω to 500Ω, for example. At this point, in the case in which a gate capacitance of the transistor 11 is 2 nF, a time constant when the gate potential of the transistor 11 increases becomes from 2 ns to 1 μs. Also, in the case in which the resistances of the resistors 51a and 51b are both 40Ω, and the gate capacitance of the transistor 11 is 2 nF, the time constant when the gate potential of the transistor 11 increases becomes 80 ns, and the time constant when the gate potential decreases becomes 40 ns.

A resistance of the resistor 52a is able to be set from 1Ω to 500Ω, for example. At this point, in the case in which a gate capacitance of the transistor 12 is 2 nF, a time constant when the gate potential of the transistor 12 increases becomes from 2 ns to 1 μs. Also, in the case in which the resistances of the resistors 52a and 52b are both 40Ω, and the gate capacitance of the transistor 12 is 2 nF, the time constant when the gate potential of the transistor 12 increases becomes 80 ns, and the time constant when the gate potential decreases becomes 40 ns.

Note that the speeds at which the gate potential of the transistors 11 and 12 increases or decreases are affected by not only the gate capacitance of the transistors 11 and 12, but also other parasitic capacitances. In addition, it should be noted that the gate capacitance of the transistors 11 and 12 also varies depending on a drain-source voltage of the transistor.

A cathode of the diode 31 is connected to the other terminal of the first delay circuit. In other words, the cathode of the diode 31 is connected to the gate of the transistor 11 via the first delay circuit. A positive electrode of a gate power supply 41 is connected to the anode of the diode 31. A negative electrode of the gate power supply 41 is connected to a third node N3. The gate power supply 41 outputs a DC voltage (for example, from 0.2 V to 50 V) that is higher than sum of each threshold voltage VTH of a high withstand voltage transistor 11 (for example, an enhancement-mode transistor with a threshold voltage VTH from 0.1 V to 7 V) and a forward-direction voltage drop of the diode 31.

A capacitor 21 is connected between the other terminal of the first delay circuit and the second node N2. Note that the capacitor 21 is provided to apply to the gate of the transistor 11 the voltage obtained by summing a voltage of the second node N2 and a output voltage of the gate power supply 41. For example, when the second node N2 and a third node N3 are both at ground potential, the output potential of the gate power supply 41 is applied to the gate of the high withstand voltage transistor 11 via the diode 31 and the first delay circuit. After that, even if the potential of the second node N2 rises while the third node N3 stays at ground potential, a potential difference between the second node N2 and the gate of the high withstand voltage transistor 11 is maintained by a capacitive coupling of the capacitor 21.

A gate driver 81 is connected to the other terminal of the second delay circuit. In other words, the gate driver 81 is connected to the gate of the transistor 12 via the second delay circuit. The gate driver 81 controls the gate voltage of the transistor 12 to turn the transistor 12 on and off. Consequently, for example, if a high potential is connected to the first node N1 and the ground potential is connected to the second node N2, an intermittent current flows from the first node N1 towards the second node N2, and basic operation as a switching power supply is performed.

As described above, the capacitor 21, the diode 31, and the gate power supply 41 are provided in order to apply to the gate of the transistor 11 a voltage that is higher than a voltage obtained by adding a threshold voltage of the transistor 11 (enhancement mode) to the voltage of the second node N2, and thereby turn on the transistor 11. In the case of using a transistor with a negative threshold voltage VTH (depletion mode) as the transistor 11, it is also possible not to use the capacitor 21, the diode 31, and the gate power supply 41, and directly connect the second node N2 to the other terminal of the first delay circuit.

An anode and a cathode of a Zener diode 61 are connected to the source and the drain of the transistor 12, respectively. The Zener diode 61 is provided to prevent a voltage exceeding a designated voltage from being applied between the source and the drain of the low withstand voltage transistor 12.

A first terminal of a resistor 71a is connected to the drain of the transistor 11, while the other terminal of the resistor 71a is connected to a first terminal of a capacitor 71b. The other terminal of the capacitor 71b is connected to the source of the transistor 12. The resistor 71a and the capacitor 71b are provided to absorb transient high voltages produced when a switching power supply device 1 performs switching.

Among the respective elements constituting the switching power supply device 1 illustrated in FIG. 1, the capacitor 21, the diode 31, the gate power supply 41, and the gate driver

81 constitute a driving circuit. The driving circuit is not limited to that illustrated in FIG. 1, but at least includes the following two functions. The first function is a function of turning on the transistors 11 and 12 when a current flows from the first node N1 to the second node N2, and turning on the transistor 11 while also turning off the transistor 12 when a current flows from the second node N2 to the first node N1. The second function is a function of turning on the transistor 11 by applying to the gate of the transistor 11 a voltage that is higher than the voltage obtained by adding the threshold value of the transistor 11 to the voltage of the second node N2.

Note that in the case of a current flowing from the second node N2 to the first node N1, the first function turns on the transistor 12 after current starts to flow from the second node N2 to the first node N1, and turn off the transistor 12 before current stops flowing from the second node N2 to the first node N1. The driving circuit is able to include discrete elements, or be formed on a single semiconductor chip as an integrated circuit. In addition, the driving circuit may also include additional functions other than the above two functions.

Next, operation of the switching power supply device 1 according to the first preferred embodiment will be described. Operation of the switching power supply device 1 is generated divided into two modes: a case of a current flowing from the first node N1 to the second node N2, and a case of a current flowing from the second node N2 to the first node N1.

First, the case of a current flowing from the first node N1 to the second node N2 will be described. In the case of a current flowing from the first node N1 to the second node N2, the transistors 11 and 12 are turned on. First, an operation of making a current start to flow from the first node N1 to the second node N2 (ON operation) will be described. After that, an operation of cutting off the current (OFF operation) will be described.

First, ON operation will be described. As an example, suppose that a 400 V power supply is connected to the first node N1, and in an initial state, the second node N2 is at ground potential (0 V). Note that the third node N3 is assumed to be fixed at a ground potential. In addition, suppose that a threshold voltage VTH of the transistor 11 is 3 V. Furthermore, suppose that the gate power supply 41 outputs a voltage of 10 V. In the initial state, the gate driver 81 is outputting an OFF potential (for example, 0 V using the potential of the second node N2 as a reference) to the gate of the transistor 12, and the transistor 12 is turned off.

In the initial state, 10 V is applied to the gate of the transistor 11. Since a threshold voltage VTH of the transistor 11 is 3 V, a potential at the source of the transistor 11 (the drain of the transistor 12) is 7 V. In other words, 393 V is applied between the source and the drain of the high withstand voltage transistor 11, and 7 V is applied between the source and the drain of the transistor 12.

In this state, the gate driver 81 outputs an ON potential (for example, 15 V using a potential of the second node N2 as a reference) to the transistor 12. At this point, a current flows from the gate driver 81, through the resistor 52a of the second delay circuit, to the gate of the transistor 12, and the gate potential of the transistor 12 starts to increase. When the gate potential of the transistor 12 exceeds the threshold voltage VTH of the transistor 12, a current starts to flow from the drain to the source of the transistor 12.

A subsequent behavior of the switching power supply device 1 is different depending on whether the potential of the second node N2 remains unchanged, or keeps increasing.

In an inverter provided by connecting the switching power supply device 1 in series as discussed later, immediately after a start of the ON operation of the low withstand voltage transistor, the inverter exhibits behavior in which a potential of the node on the source side of the low withstand voltage transistor does not change, and starts increasing later. Consequently, the behavior in the case in which the potential of the second node N2 does not change and the case in which the potential of the second node N2 increases are illustrated below.

In the case in which the potential of the second node N2 does not change, the gate potential of the transistor 11 capacitively coupled by the capacitor 21 likewise does not change. In the transistor 11, the source potential of the transistor 11 drops below 7 V, and thus current flows from the drain to the source. An amount of current that flows depends on a magnitude of a divergence from 7 V of the source potential of the transistor 11.

Consequently, a rate of increase of the amount of current flowing through the transistors 11 and 12 in this case depends entirely on the rate of increase of the gate potential of the transistor 12. In other words, if a resistance of the resistor 52a in the second delay circuit is low, a switching speed becomes faster, whereas if the resistance is high, the switching speed becomes slower.

On the other hand, in the case in which a potential of the second node N2 increases, the gate potential of the transistor 11 capacitively coupled by the capacitor 21 likewise increases. If the potential of the second node N2 increases, the source-drain voltage of the transistor 11 also decreases to produce an action of decreasing a current flowing from the drain to the source of the transistor 11. On the other hand, if the gate potential of the transistor 11 increases, an action of increasing the current flowing from the drain to the source of the transistor 11 is produced. Ultimately, the amount of current flowing through the transistors 11 and 12 is decided by a counterbalance of these two actions. If the amount of current flowing through the transistors 11 and 12 is large, the rate of increase of the potential of the second node N2 becomes larger.

In this case, the resistance of the resistor 51a of the first delay circuit affects the counterbalance of the two actions. If the resistance of the resistor 51a is low, the increase in the potential of the second node N2 rapidly causes the gate potential of the transistor 11 to rise, whereas if the resistance of the resistor 51a is high, it takes time for the rise in the potential of the second node N2 to increase the gate potential of the transistor 11. For this reason, if the resistance of the resistor 51a in the first delay circuit is low, the switching speed becomes faster, whereas if the resistance is high, the switching speed becomes slower.

Next, OFF operation will be described. As an example, suppose that a 400 V power supply is connected to a first node N1, a currently is flowing from the first node N1 to the second node N2, and a potential of the second node N2 is also 400 V. Note that a third node N3 is assumed to be fixed at a ground potential. In addition, suppose that a threshold voltage VTH of the transistor 11 is 3 V. Furthermore, suppose that a gate power supply 41 outputs a voltage of 10 V. In an initial state, the gate driver 81 is outputting an ON potential (for example, 15 V using the potential of the second node N2 as a reference) to the gate of the transistor 12, and the transistor 12 is turned on. The gate potential of the transistor 11 is 410 V, and the transistor 12 is turned on.

In this state, the gate driver 81 outputs an OFF potential (for example, 0 V using the potential of the second node N2 as a reference) to the transistor 12. At this point, a current flows from the gate of the transistor 12, through the resistors 52a and 52b of the second delay circuit, to the gate driver 81, and the gate potential of the transistor 12 starts to decrease. As the gate potential of the transistor 12 decreases, the current flowing from the drain to the source of the transistor 12 also starts to decrease.

A subsequent behavior of the switching power supply device 1 is different depending on whether the potential of the second node N2 remains unchanged, or keeps decreasing. In an inverter provided by connecting the switching power supply device 1 in series as discussed later, immediately after the start of the OFF operation of the low withstand voltage transistor, the inverter exhibits behavior in which the potential of the node on the source side of the low withstand voltage transistor decreases. After that, the potential does not change, and the amount of current only decreases. Consequently, the behavior in the case in which the potential of the second node N2 decreases and the case in which the potential of the second node N2 does not change are illustrated below.

In the case in which the potential of the second node N2 decreases, the gate potential of the transistor 11 capacitively coupled by the capacitor 21 likewise decreases. If the potential of the second node N2 decreases, the source-drain voltage of the transistor 11 also increases to produce an action of increasing the current flowing from the drain to the source of the transistor 11. On the other hand, if the gate potential of the transistor 11 decreases, an action of decreasing the current flowing from the drain to the source of the transistor 11 is produced. Ultimately, the amount of current flowing through the transistors 11 and 12 is decided by the counterbalance of these two actions. If the amount of current flowing through the transistors 11 and 12 is small, the rate of decrease of the potential of the second node N2 becomes larger.

In this case, a combined resistance of the resistors 51a and 51b of the first delay circuit affects a counterbalance of the two actions. If the combined resistance of the resistors 51a and 51b is low, a decrease in the potential of the second node N2 rapidly causes the gate potential of the transistor 11 to decrease, whereas if the combined resistance of the resistors 51a and 51b is high, it takes time for the decrease in the potential of the second node N2 to decrease the gate potential of the transistor 11. For this reason, if the combined resistance of the resistors 51a and 51b in the first delay circuit is low, the switching speed becomes faster, whereas if the combined resistance is high, the switching speed becomes slower.

On the other hand, in the case in which the potential of the second node N2 does not change, the gate potential of the transistor 11 capacitively coupled by the capacitor 21 likewise does not change. Consequently, the rate of decrease of the amount of current flowing through the transistors 11 and 12 in this case depends entirely on the rate of decrease of the gate potential of the transistor 12. In other words, if the combined resistance of the resistors 52a and 52b in the second delay circuit is low, the switching speed becomes faster, whereas if the combined resistance is high, the switching speed becomes slower.

Next, the case of a current flowing from the second node N2 to the first node N1 will be described. In the case of a current flowing from the second node N2 to the first node N1, the transistor 11 is turned on while the transistor 12 is turned off.

As an example, suppose that a 400 V power supply is connected to the first node N1, and in an initial state, the potential of the second node N2 is also 400 V. Note that the third node N3 is assumed to be fixed at the ground potential. In addition, suppose that a threshold voltage VTH of the transistor 11 is 3 V. Furthermore, suppose that a gate power supply 41 outputs a voltage of 10 V. The gate potential of the transistor 11 stays at 410 V, which is 10 V higher than the second node N2, due to the action of the capacitor 21, and the transistor 11 is turned on. The gate driver 81 is outputting an OFF potential (for example, 0 V using the potential of the second node N2 as a reference) to the gate of the transistor 12, and the transistor 12 is turned off.

In this state, if the potential of the second node N2 rises by a Vf (for example, 0.5 V) of a built-in diode 12a of the transistor 12 compared to the potential of the first node N1, a current flows from the second node N2 to the first node N1 through the built-in diode 12a and the transistor 11. At this point, minority carriers accumulate in the built-in diode 12a.

If a difference between the potential of the second node N2 and the potential of the first node N1 becomes Vf or less, the current flowing from the second node N2 to the first node N1 stops flowing. However, since minority carriers accumulated in the built-in diode 12a are released, a recovery current flows for a while. This recovery current becomes a major cause of loss for the switching power supply device.

In this way, when current flows from the second node N2 to the first node N1, switching is not performed. However, since current flows through the built-in diode 12a of the transistor 12, a voltage drop by Vf is produced by the built-in diode 12a, resulting in loss. For this reason, the transistor 12 is turned on after current starts to flow from the second node N2 to the first node N1, and the transistor 12 is turned off before current stops flowing from the second node N2 to the first node N1, thereby reducing losses caused by the voltage drop in the built-in diode 12a.

The voltage to apply to the gate of the transistor 11 in order to turn on the transistor 11 is decided by the output voltage of the gate power supply 41. Additionally, the voltage to apply to the gate of the transistor 12 in order to turn on the transistor 12 is decided by the output voltage of the gate driver 81. Consequently, a voltage to apply to the gate of the transistor 11 and a voltage to apply to the gate of the transistor 12 is able to be decided independently.

When current flows from the first node N1 to the second node N2, the transistors 11 and 12 are turned on, but it is preferable to apply respectively different potentials to the gate of the transistor 11 and the gate of the transistor 12. Consequently, a switching power supply device having a desired performance as discussed below is realized.

For example, when current flows from the first node N1 to the second node N2, a gate overdrive to apply to the gate of the transistor 11 is made larger than a gate overdrive to apply to the gate of the transistor 12. Gate overdrive refers to the voltage value obtained by subtracting a threshold voltage VTH from the gate-source voltage.

Generally, a cost of the high withstand voltage transistor 11 is overwhelmingly higher than a cost of the low withstand voltage transistor 12. In addition, high withstand voltage transistors becomes more costly for a lower on-resistance (that is, for a larger rated current). Consequently, by applying as large a gate overdrive as possible to the transistor 11 to lower an on-resistance, a high withstand voltage transistor with a smaller rated current is adopted to lower costs. If the gate overdrive of the transistor 12 is similarly raised, the transition time of the gate potential of the transistor 12 increases, thus lowering the switching speed. Consequently, it is preferable to increase only the gate overdrive of the transistor 11 to be larger than the gate overdrive of the transistor 12. This is the preferable configuration when prioritizing cost reduction of the switching power supply device.

Alternatively, when current flows from the first node N1 to the second node N2, the gate overdrive to apply to the gate of the transistor 11 is made smaller than the gate overdrive to apply to the gate of the transistor 12.

As described previously, when a current flows from the first node N1 to the second node N2, during the operation (ON operation) by which current starts to flow from the first node N1 to the second node N2, the source potential of the transistor 11 (that is, the drain potential of the transistor 12) transitions to a value close to the potential obtained by subtracting the threshold voltage VTH of the transistor 11 from the gate potential of the transistor 11. In the previous description, when the gate potential of the transistor 11 is 10 V and the threshold voltage VTH of the transistor 11 is 3 V (consequently, the gate overdrive when ON is 7 V), the source potential of the transistor 11 (that is, the drain potential of the transistor 12) transitions to a value close to 7 V. In the case in which the potential of the second node N2 does not change, the source-drain voltage of the transistor 12 also transitions to a value close to 7 V.

As the above description demonstrates, by reducing the gate overdrive of the transistor 11 when current flows from the first node N1 to the second node N2, the source-drain voltage of the transistor 12 during switching is reduced or prevented. In actual operation, a high voltage is instantaneously applied to the source potential of the transistor 11 (that is, the drain potential of the transistor 12) due to noise and the like, and thus by applying as small a gate overdrive as possible to the transistor 11 to lower the source-drain voltage of the transistor 12, reliability is improved further. If the gate overdrive of the transistor 12 is similarly lowered, the on-resistance of the transistor 12 increases, thus increasing loss. Consequently, it is preferable to decrease only the gate overdrive of the transistor 11 to be smaller than the gate overdrive of the transistor 12. This is the preferable configuration when prioritizing reliability.

The above thus describes operation of the switching power supply device 1 according to the first preferred embodiment of the present invention.

According to the switching power supply device 1 according to the first preferred embodiment of the present invention, there is provided a transistor 11 (first transistor) whose drain (first electrode) is connected to a first node N1. In addition, there is also provided a transistor 12 (second transistor) whose drain is connected to a source (second electrode) of the transistor 11, and whose source is connected to a second node N2. Additionally, each of the transistors 11 and 12 includes a parasitic diode connected in a forward direction between the source and the drain. Also, a source-drain withstand voltage of the transistor 11 is higher than a source-drain withstand voltage of the transistor 12. In addition, there is provided a driving circuit that turns on the transistors 11 and 12 when a current flows from the first node N1 to the second node N2, and turns on the transistor 11 while also turning off the transistor 12 when a current flows from the second node N2 to the first node N1. In addition, the driving circuit turns on the transistor 11 by applying to the gate of the transistor 11 a voltage that is higher than the voltage obtained by adding the threshold voltage of the transistor 11 to the voltage of the second node N2.

According to a preferred embodiment of the present invention, in the transistor 12 having a low withstand voltage compared to the transistor 11 having a high withstand voltage, a recovery current caused by a built-in diode is small. Subsequently, when current flows from the second node N2 to the first node N1, the transistor 11 turns on and the transistor 12 turns off, and thus a current flows only to the built-in diode of the transistor 12 having a small recovery current, without a current flowing to the built-in diode of the transistor 11 having a large recovery current. Consequently, the built-in diodes of the transistors preferably are utilized without externally attaching a freewheeling diode, and losses due to recovery current are significantly reduced or prevented. For the above reason, a highly efficient and low-cost switching power supply device is provided.

Also, according to a preferred embodiment of the present invention, the high withstand voltage transistor 11 and the low withstand voltage transistor 12 are connected in series, and the low withstand voltage transistor 12 performs a switching operation. Since a majority of a power supply voltage is applied between the source and the drain of the high withstand voltage transistor 11, the voltage between the source and the drain of the low withstand voltage transistor 12 that performs the switching operation is able to be small. For this reason, a degree of influence on the gate voltage of the transistor 12 that performs the switching operation exerted due to variation in a capacitively coupled drain voltage is able to be small. As a result, misfiring of the transistor 12 due to variation in the gate potential is effectively reduced or prevented. For the above reason, a highly reliable switching power supply device is provided.

Furthermore, in the switching power supply device 1 according to the first preferred embodiment, a first delay circuit that delays a potential variation of a gate of the transistor 11 and a second delay circuit that delays a potential variation of a gate of a transistor 12 are connected to the gate of the transistor 11 and the gate of the transistor 12, respectively. Additionally, at least one of the first delay circuit and the second delay circuit includes a structure that causes the potential of the gate of the transistor 11 or the gate of the transistor 12 to be increased and decreased at different speeds.

According to a preferred embodiment of the present invention, in at least one of the transistors 11 and 12, it is possible to decide independently the speeds at which the gate potential increases and decreases. Consequently, since a rising and falling speed of switching is able to be decided independently, switching in the circuit is able to be sped up more and losses are significantly reduced or prevented more finely within a range in which the circuit does not oscillate.

Note that in the case of a current flowing from the second node N2 to the first node N1, the switching power supply device 1 according to the first preferred embodiment turns on the transistor 12 after current starts to flow from the second node N2 to the first node N1, and turns off the transistor 12 before current stops flowing from the second node N2 to the first node N1.

According to a preferred embodiment of the present invention, a time of current flowing to the built-in diode 12a of the transistor 12 is shortened, thereby reducing loss due to a voltage drop in the built-in diode 12a.

Second Preferred Embodiment

Figure 2:
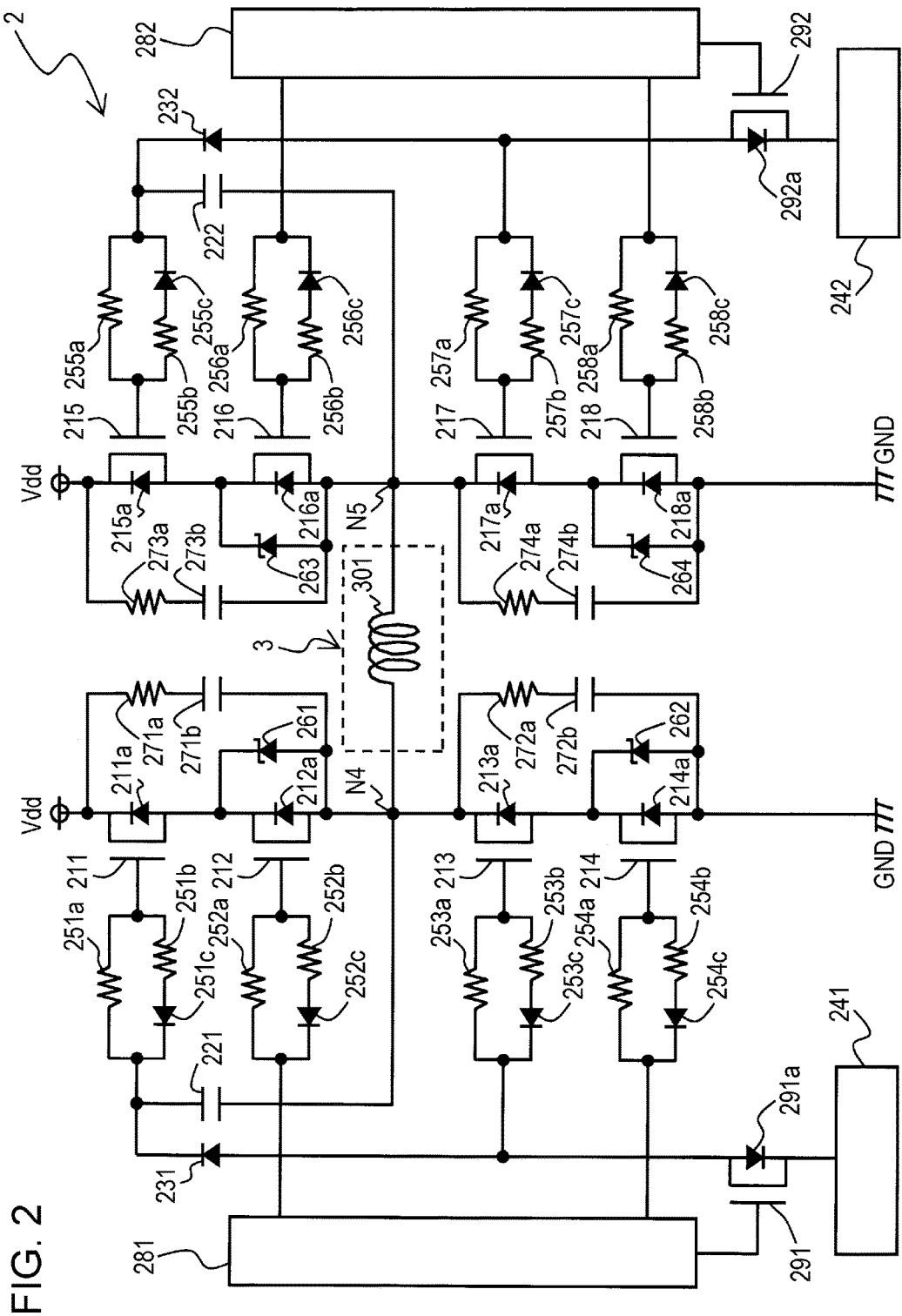
FIG. 2 is a circuit block diagram illustrating a configuration of an inverter including the switching power supply device illustrated in FIG. 1, according to a second preferred embodiment of the present invention.

As illustrated in FIG. 2, an inverter 2 according to a second preferred embodiment of the present invention includes n-channel MOS transistors 211 to 218, 291, and 292, capacitors 221, 222, and 271b to 274b, diodes 231, 232, and 251c to 258c, gate power supplies 241 and 242, resistors 251a to 258a, 251b to 258b, and 271a to 274a, Zener diodes 261 to 264, and gate drivers 281 and 282. The transistors 211 to 218, 291, and 292 have built-in parasitic diodes 211a to 218a, 291a, and 292a, respectively.

An anode of each of the parasitic diodes 211a to 218a, 291a, and 292a is connected to a source of each of the corresponding transistors 211 to 218, 291, and 292, respectively, while a cathode of each of a parasitic diodes 211a to 218a, 291a, and 292a is connected to a drain of each of the corresponding transistors 211 to 218, 291, and 292, respectively.

Each of the transistors 211, 213, 215, and 217 is a high withstand voltage transistor, having a source-drain withstand voltage of 600 V, for example. Each of the transistors 212, 214, 216, and 218 is a low withstand voltage transistor, having a source-drain withstand voltage of 30 V, for example. Each of parasitic diodes 212a, 214a, 216a, and 218a of low withstand voltage transistors 212, 214, 216, and 218 operates as a freewheeling diode.

Drains of the transistors 211 and 215 both receive a power supply voltage Vdd. A drain of each of the transistors 212 and 216 is connected to a source of each of the transistors 211 and 215, respectively, while a source of each of the transistors 212 and 216 is connected to output nodes N4 and N5, respectively. A drain of each of the transistors 217 and 217 is connected to the output nodes N4 and N5, respectively. A drain of each of the transistors 214 and 218 is connected to a source of each of the transistors 213 and 217, respectively, while sources of the transistors 214 and 218 are both connected to a ground voltage GND line. The transistors 211 and 212 constitute an upper-left arm, while the transistors 213 and 214 constitute a lower-left arm, transistors 215 and 216 constitute an upper-right arm, and the transistors 217 and 218 constitute a lower-right arm. A load 3 includes a coil 301, and is connected between the output nodes N4 and N5.

The resistor 251a, the resistor 251b, and the diode 251c constitute a first delay circuit. The resistor 251b and the diode 251c are connected in series. The resistor 251a is additionally connected in parallel to the resistor 251b and the diode 251c connected in series, thereby forming the first delay circuit. A first terminal of the first delay circuit is connected to a gate of the transistor 211.

Similarly, the resistors 252a to 258a, the resistors 252b to 258b, and the diodes 252c to 258c constitute second to eighth delay circuits, respectively. The resistors 252b to 258b and the diodes 252c to 258c are respectively connected in series. The resistors 252a to 258a are additionally connected in parallel to the resistors 252b to 258b and the diodes 252c to 258c connected in series, respectively, thereby forming the second to eighth delay circuits. A first terminal of each of the second to eighth delay circuits is connected to the gate of each of the transistors 212 to 218, respectively.

The cathode of the diode 231 is connected to the other terminal of the first delay circuit. In other words, a cathode of the diode 231 is connected to a gate of the transistor 211 via the first delay circuit. A source of the transistor 291 is connected to an anode of the diode 231, and connected to a gate of the transistor 213 via the third delay circuit. An output node of the gate power supply 241 is connected to a drain of the transistor 291. A gate power supply 241 outputs a DC voltage (for example, from 0.2 V to 50 V) that is higher than a sum of each threshold voltage VTH of a high withstand voltage transistors 211 and 213 (for example, an enhancement-mode transistor with a threshold voltage VTH from 0.1 V to 7 V) and a forward-direction voltage drop of the diode 231.

A cathode of the diode 232 is connected to the other terminal of the fifth delay circuit. In other words, the cathode of the diode 232 is connected to a gate of the transistor 215 via the fifth delay circuit. A source of the transistor 292 is connected to an anode of the diode 232, and connected to a gate of the transistor 217 via the seventh delay circuit. An output node of a gate power supply 242 is connected to a drain of the transistor 292. The gate power supply 242 outputs a DC voltage (for example, from 0.2 V to 50 V) that is higher than the sum of each threshold voltage VTH of the high withstand voltage transistors 215 and 217 (for example, an enhancement-mode transistor with a threshold voltage VTH from 0.1 V to 7 V) and a forward-direction voltage drop of the diode 232.

The capacitor 221 is connected between the other terminal of the first delay circuit and an output node N4. The capacitor 222 is connected between the other terminal of the fifth delay circuit and an output node N5. Note that the capacitor 221 is provided to apply to the gate of the transistor 211 the voltage obtained by summing a voltage of the output node N4 and an output voltage of the gate power supply 241. The capacitor 222 is provided to apply to a gate of the transistor 215 a voltage obtained by summing a voltage of the output node N5 and an output voltage of the gate power supply 242. For example, when the output node N4 is at ground potential, the output potential of the gate power supply 241 is applied to the gate of the high withstand voltage transistor 211 via the transistor 291, the diode 231, and the first delay circuit. After that, even if the potential of the output node N4 rises, a potential difference between the output node N4 and the gate of the high withstand voltage transistor 211 is maintained by a capacitive coupling of the capacitor 212. Similarly, a potential difference between the output node N5 and the gate of the high withstand voltage transistor 215 is kept at the output voltage of the gate power supply 242.

The gate driver 281 is connected to the other terminal of each of the second and fourth delay circuits. In other words, the gate driver 281 is connected to a gate of each of the transistors 212 and 214 via the second and fourth delay circuits, respectively. The gate driver 281 controls a gate voltage of each of the transistors 212 and 214 to turn the transistors 212 and 214 on and off.

Similarly, the gate driver 282 is connected to the other terminal of each of the sixth and eighth delay circuits. In other words, the gate driver 282 is connected to a gate of each of the transistors 216 and 218 via the sixth and eighth delay circuits, respectively. The gate driver 282 controls a gate voltage of each of the transistors 216 and 218 to turn the transistors 216 and 218 on and off.

An anode of each of the Zener diodes 261 to 264 is connected to the source of each of the transistors 212, 214, 216, and 218, respectively, while a cathode of each of the Zener diodes 261 to 264 is connected to the drain of each of the transistors 212, 214, 216, and 218, respectively. The Zener diodes 261 to 264 are provided to prevent a voltage exceeding a designated voltage from being applied between the source and the drain of the low withstand voltage transistors 212, 214, 216, and 218.

A first terminal of each of the resistors 271a to 274a is connected to the drain of each of the transistors 211, 213, 215, and 217, respectively, while the other terminal of each of the resistors 271a to 274a is connected to a first terminal of each of the capacitors 271b to 274b, respectively, and the other terminal of each of the capacitors 271b to 274b is connected to the source of each of the transistors 212, 214, 216, and 218, respectively. The resistors 271a to 274a and the capacitors 271b to 274b are provided to absorb transient high voltages produced when an inverter 2 performs switching.

The inverter 2 according to the second preferred embodiment is the result of applying four of a switching power supply devices according to the first preferred embodiment to the upper-left arm, the lower-left arm, the upper-right arm, and the lower-right arm, respectively. In the lower-left arm and the lower-right arm, a diode and a capacitor connected to the high withstand voltage transistor via a delay circuit are not provided. This is because whereas a source potential of the low withstand voltage transistor is not fixed in the upper-left arm and the upper-right arm, a source potential of the low withstand voltage transistor is fixed to the ground potential GND in the lower-left arm and the lower-right arm.

Next, operation of the inverter will be described. In the case of supplying AC power to the load 3, the transistors 291 and 292 are turned on, and a DC voltage that is higher than the threshold voltage VTH of the high withstand voltage transistors 211, 213, 215, and 217 is applied to the gate of each of the high withstand voltage transistors 211, 213, 215, and 217. In this state, first, the low withstand voltage transistors 212 and 218 are turned on. Consequently, current flows from the power supply voltage Vdd line, through the transistors 211 and 212, the load 3, and the transistors 217 and 218, to the ground voltage GND line, and electromagnetic energy is accumulated in the coil 301 constituting the load 3.

Next, the low withstand voltage transistors 212 and 218 are turned off. An electromagnetic energy accumulated in the coil 301 constituting the load 3 causes current to flow back from the ground voltage GND line, through the parasitic diode 214a, the transistor 213, the load 3, the parasitic diode 216a, and the transistor 215, to the power supply voltage Vdd line.

Subsequently, the low withstand voltage transistors 214 and 216 are turned on at the timing when a reflux current ceases. Consequently, current flows from the power supply voltage Vdd line, through the transistors 215 and 216, the load 3, and the transistors 213 and 214, to a ground voltage GND line.

Next, the low withstand voltage transistors 214 and 216 are turned off. An electromagnetic energy accumulated in the coil 301 constituting the load 3 causes current to flow back from the ground voltage GND line, through the parasitic diode 218a, the transistor 217, the load 3, the parasitic diode 212a, and the transistor 211, to the power supply voltage Vdd line. Thereafter, AC power is supplied to the load 3 similarly.

Meanwhile, in such an inverter, in order to adjust the power to supply to the load 3, a chopping operation of turning a lower-right arm (transistors 217 and 218) on and off while keeping an upper-left arm (transistors 211 and 212) on, and a chopping operation of turning a lower-left arm (transistors 213 and 214) on and off while keeping an upper-right arm (transistors 215 and 216) on, is performed alternately in some cases.

Conversely, a chopping operation of turning an upper-left arm (transistors 211 and 212) on and off while keeping a lower-right arm (transistors 217 and 218) on, and a chopping operation of turning an upper-right arm (transistors 215 and 216) on and off while keeping a lower-left arm (transistors 213 and 214) on, is performed alternately in some cases.

Hereinafter, the chopping operation of turning the upper-left arm (transistors 211 and 212) on and off while keeping the lower-right arm (transistors 217 and 218) on will be described as a first example of chopping operation. In this case, a current flows from the output node N4 to the output node N5.

Figure 3:
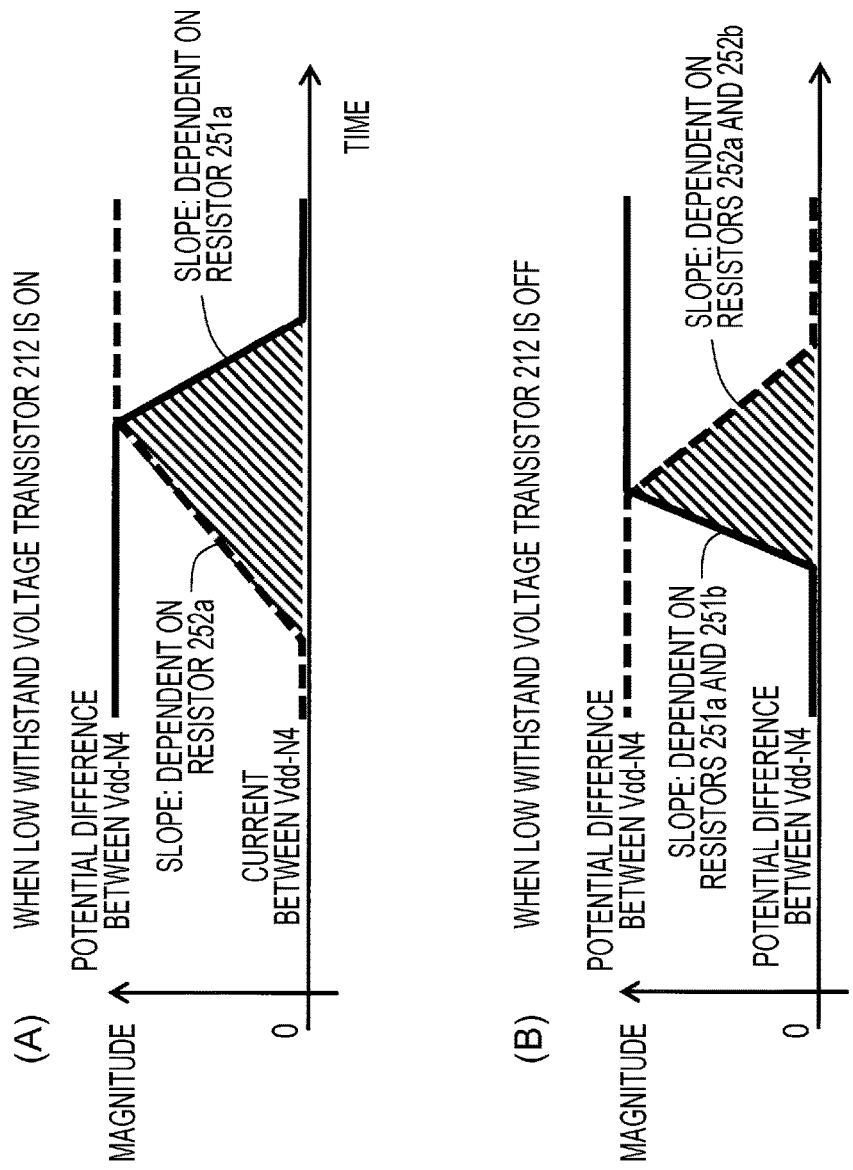
FIG. 3 illustrates diagrammatic timing charts (A, B) for explaining the advantageous effects of the inverter illustrated in FIG. 2.

First, the operation of turning on the transistor 212 of the upper-left arm will be described. FIG. 3(A) illustrates change over time in a voltage difference between a power supply voltage Vdd line and the output node N4 and an amount of current flowing from the power supply voltage Vdd line to the output node N4 when the transistor 212 is turned on. As an example, suppose that a power supply with a voltage of 400 V is connected to the power supply voltage Vdd line, and the output node N4 is −1 V in a state before turning on the transistor 212. The output node N4 is −1 V because current is flowing from a ground voltage GND line, through the built-in diode 214a of the transistor 214, the transistor 213, and the output node N4, to the output node N5, causing a voltage drop in the built-in diode. In addition, suppose that a threshold voltage VTH of the transistor 211 is 3 V. Furthermore, suppose that the gate power supply 241 outputs a voltage of 10 V. In the state before turning on the transistor 212, the gate driver 281 is outputting an OFF potential (for example, 0 V using the potential of the output node N4 as a reference) to the gate of the transistor 212, and the transistor 212 is turned off.

In a state before turning on the transistor 212, 10 V, that is, the output voltage of the gate power supply 241, is applied to the gate of the transistor 211. Since a threshold voltage VTH of the transistor 211 is 3 V, the potential at the source of the transistor 211 (the drain of the transistor 212) is 7 V. In other words, 393 V is applied between the source and the drain of the high withstand voltage transistor 211, and 8 V is applied between the source and the drain of the transistor 212.

In this state, the gate driver 281 outputs an ON potential (for example, 15 V using the potential of the output node N4 as a reference) to the transistor 212. The gate potential of the transistor 212 gradually increases, and upon exceeding the threshold voltage VTH of the transistor 212, a current starts to flow from the drain to the source of the transistor 212.

Since the amount of current flowing from the output node N4 to the output node N5 is kept constant by the coil 301, if the amount of current flowing from the drain to the source of the transistor 212 increases, or in other words, if the amount of current flowing through the upper-left arm increases, the amount of current flowing through the lower-left arm decreases. The potential of the output node N4 is kept at nearly −1 V until the amount of current flowing through the lower-left arm becomes 0. At this point, a speed at which the current flowing from the power supply voltage Vdd line to the output node N4 (the amount of current flowing through the upper-left arm) changes is explained similarly to the first preferred embodiment, and depends on the resistor 252a.

Once the amount of current flowing through the lower-left arm becomes 0, the potential of the output node N4 starts to increase. At this point, if the current for charging the parasitic capacitance for increasing the potential of the output node N4 is ignored, the current flowing through the upper-left arm becomes equal to the current flowing from the output node N4 to the output node N5, and becomes nearly constant. At this point, the speed at which the potential difference between the power supply voltage Vdd line and the output node N4 changes is explained similarly to the first preferred embodiment, and depends on the resistor 251a. When the output node N4 reaches the same 400 V as the power supply voltage Vdd line, the operation of turning on the transistor 212 is completed.

Next, an operation of turning off the transistor 212 of the upper-left arm will be described. FIG. 3(B) illustrates change over time in a voltage difference between the power supply voltage Vdd line and the output node N4 and an amount of current flowing from the power supply voltage Vdd line to the output node N4 when the transistor 212 is turned off. In a state before turning off the transistor 212, the potential of the output node N4 is the same 400 V as a power supply voltage Vdd line. In the state before turning off the transistor 212, the gate driver 281 is outputting an ON potential (15 V using the potential of the output node N4 as a reference, 415 V using the ground potential as a reference) to the gate of the transistor 212, and the transistor 212 is turned on.

In a state before turning off the transistor 212, 410 V, that is, a value obtained by adding an output voltage of the gate power supply 241 to the potential of the output node N4, is applied to the gate of the transistor 211.

In this state, the gate driver 281 outputs an OFF potential (for example, 0 V using the potential of the output node N4 as a reference) to the transistor 212. The gate potential of the transistor 212 gradually decreases, and the current flowing from the drain to the source of the transistor 212 decreases.

Since the amount of current flowing from the output node N4 to the output node N5 is kept constant by the coil 301, the potential of the output node N4 decreases. At this point, if the current discharged from the parasitic capacitance as a result of the decreasing potential of the output node N4 is ignored, the current flowing through the upper-left arm becomes equal to the current flowing from the output node N4 to the output node N5, and becomes nearly constant. At this point, a speed at which the potential difference between the power supply voltage Vdd line and the output node N4 changes is explained similarly to the first preferred embodiment, and depends on the resistors 251a and 251b.

When the potential of the output node N4 becomes −1 V, current starts to flow from the ground voltage GND line, through the built-in diode 214a of the transistor 214, the transistor 213, to the output node N4. In other words, the current in the upper-left arm decreases, while the current in the lower-left arm increases. Thereafter, the potential of the output node N4 stays at nearly −1 V. At this point, the speed at which the current flowing from the power supply voltage Vdd line to the output node N4 (the amount of current flowing through the upper-left arm) changes is explained similarly to the first preferred embodiment, and depends on the resistors 252a and 252b. When the current in the upper-left node becomes 0, the operation of turning off the transistor 212 is completed.

As the above description demonstrates, by appropriately selecting the resistors 251a, 251b, 252a, and 252b, it is possible to decide independently a switching rising speed (a rate of voltage change in the output node N4 and a rate of current change in the upper-left (lower-left) arm) and a falling speed (the rate of voltage change in the output node N4 and the rate of current change in the upper-left (lower-left) arm), when turning on and when turning off the transistor 212.

In FIG. 3(A) and FIG. 3(B), an area of a shaded region illustrates a magnitude of losses due to switching. Consequently, in order to reduce the losses due to switching it is sufficient to increase a switching speeds of both turning on and turning off a transistor, but faster switching also produces a side effect of a circuit oscillating more readily.

However, with the first and second delay circuits connected to the gate of each of the transistors 211 and 212, it is possible to decide independently the switching speed when turning on and when turning off the transistors 211 and 212. Consequently, for example, when turning on and when turning off the transistors, it is possible to speed up switching up to the limit of the range in which each transistor does not oscillate, and switching losses are significantly reduced or prevented.

Figure 4:
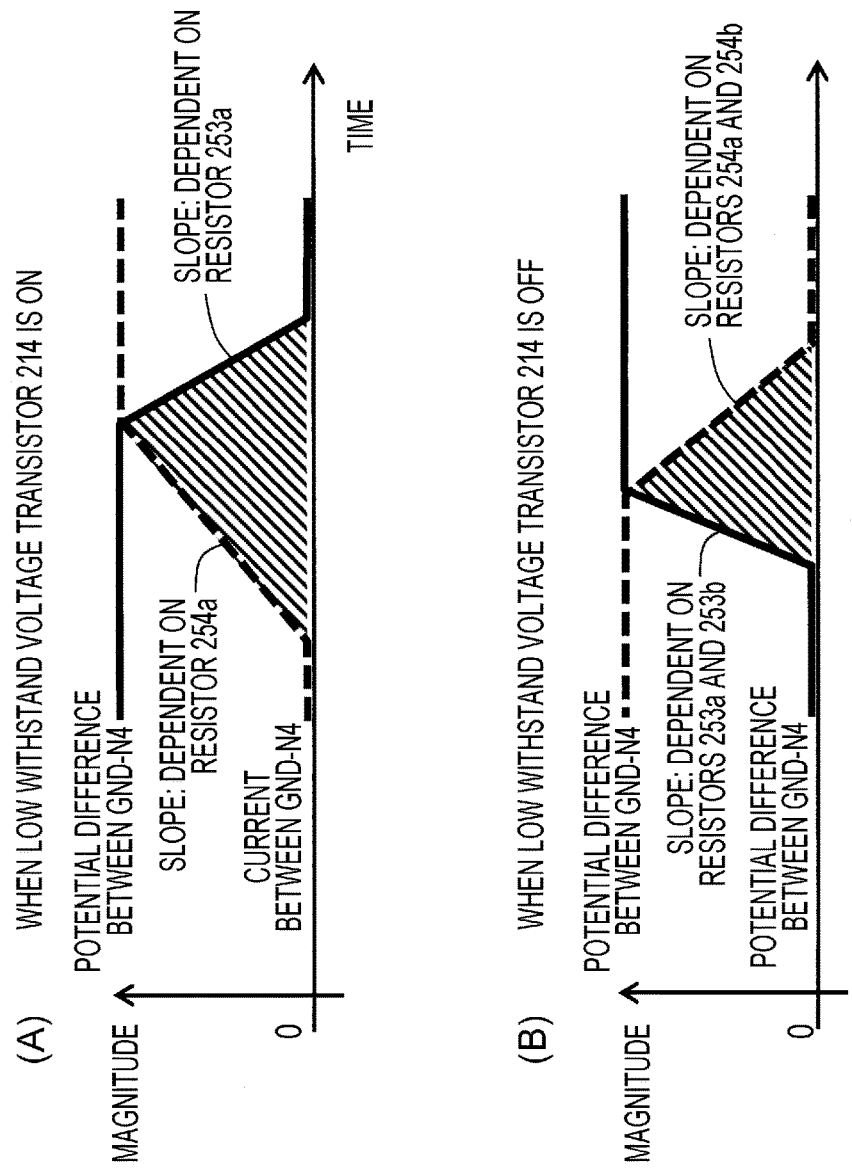
FIG. 4 illustrates other diagrammatic timing charts (A, B) for explaining the advantageous effects of the inverter illustrated in FIG. 2.

As a second example of chopping operation, FIG. 4 illustrates change over time in a voltage difference between the power supply voltage Vdd line and the output node N4 and an amount of current flowing from the power supply voltage Vdd line to the output node N4 when performing the chopping operation of turning the lower-left arm (transistors 213 and 214) on and off while keeping the upper-right arm (transistors 215 and 216) on.

Meanwhile, if attention is focused on the switching power supply device formed by a combination of the upper-left arm and the lower-left arm (or the upper-right arm and the lower-right arm) of the inverter 2 according to the inverter 2, the switching power supply device includes a following structure.

Namely, the switching power supply device includes a transistor 211 (first transistor) whose drain (first electrode) is connected to a power supply voltage line. In addition, there is also provided a transistor 212 (second transistor) whose drain is connected to a source (second electrode) of the transistor 211, and whose source is connected to an output node N4. Also, there is included a transistor 213 (third transistor) whose drain is connected to the output node N4. In addition, there is provided a transistor 214 (fourth transistor) whose drain is connected to a source of the transistor 213, and whose source is connected to a reference voltage line. Additionally, each of the transistors 211 to 214 includes a parasitic diode connected in a forward direction between a source and a drain. Also, a withstand voltage between the source and the drain of the transistor 211 is higher than a withstand voltage between the source and the drain of the transistor 212, while a withstand voltage between the source of the drain of the transistor 212 is higher than a withstand voltage between the source and the drain of the transistor 213. In addition, there is a provided a driving circuit that turns on the transistors 211 and 212 when current flows from the power supply voltage line to the output node N4, turns on the transistor 211 and turns off the transistor 212 when current flows from the output node N4 to the power supply voltage line, turns on the transistors 213 and 214 when current flows from the output node N4 to the reference voltage line, and turns on the transistor 213 and turns off the transistor 214 when current flows from the reference voltage line to the output node N4. In addition, a driving circuit turns on the transistor 211 by applying to a gate of the transistor 211 a voltage higher than a voltage obtained by adding a threshold voltage of the transistor 211 to the voltage of the output node N4, and turns on the transistor 213 by applying to a gate of the transistor 213 a voltage higher than a voltage obtained by adding a threshold voltage of the transistor 213 to a voltage of the reference voltage line.

According to a preferred embodiment of the present invention, in the transistors 212 and 213 having a low withstand voltage compared to the transistors 211 and 213 having a high withstand voltage, a recovery current caused by a built-in diode is small. Subsequently, when current flows from the output node N4 to the power supply voltage line, the transistor 211 turns on and the transistor 212 turns off, and thus a current flows only to a built-in diode of the transistor 212 having a small recovery current, without a current flowing to a built-in diode of the transistor 211 having a large recovery current. Similarly, when current flows from a reference voltage line to the output node N4, the transistor 213 turns on and the transistor 214 turns off, and thus a current flows only to a built-in diode of the transistor 214 having a small recovery current, without a current flowing to the built-in diode of the transistor 213 having a large recovery current. Consequently, the built-in diodes of the transistors preferably are utilized without externally attaching a freewheeling diode, and losses due to recovery current are significantly reduced or prevented. For the above reasons, a highly efficient and low-cost switching power supply device is provided.

In addition, in the switching power supply device formed by the combination of the upper-left arm and the lower-left arm (or the upper-right arm and the lower-right arm) of the inverter 2, first to fourth delay circuits that delay a potential variation of the gate of each of the transistors 211 to 214 are also connected to the gate of each of the transistors 211 to 214, respectively. Additionally, at least one of the first delay circuit and the second delay circuit includes a structure that causes the potential of the gate of the transistor 211 or the gate of the transistor 212 to be increased and decreased at different speeds. Furthermore, at least one of the third delay circuit and the fourth delay circuit includes a structure that causes the potential of the gate of the transistor 213 or the gate of the transistor 214 to be increased and decreased at different speeds.

According to a preferred embodiment of the present invention, in at least one of the transistors 211 and 212, and in at least one of the transistors 213 and 214, it is possible to decide independently the speeds at which the gate potential increases and decreases. Consequently, since the rising and falling speeds of switching is able to be decided independently, switching in the circuit is able to be sped up more and losses are significantly reduced or prevented more finely within a range in which the circuit does not oscillate.

The inverter of the second preferred embodiment formed by combining two switching power supply devices formed by the combination of the upper-left arm and the lower-left arm as above also exhibits similar operational advantages.

Third Preferred Embodiment

Figure 5:
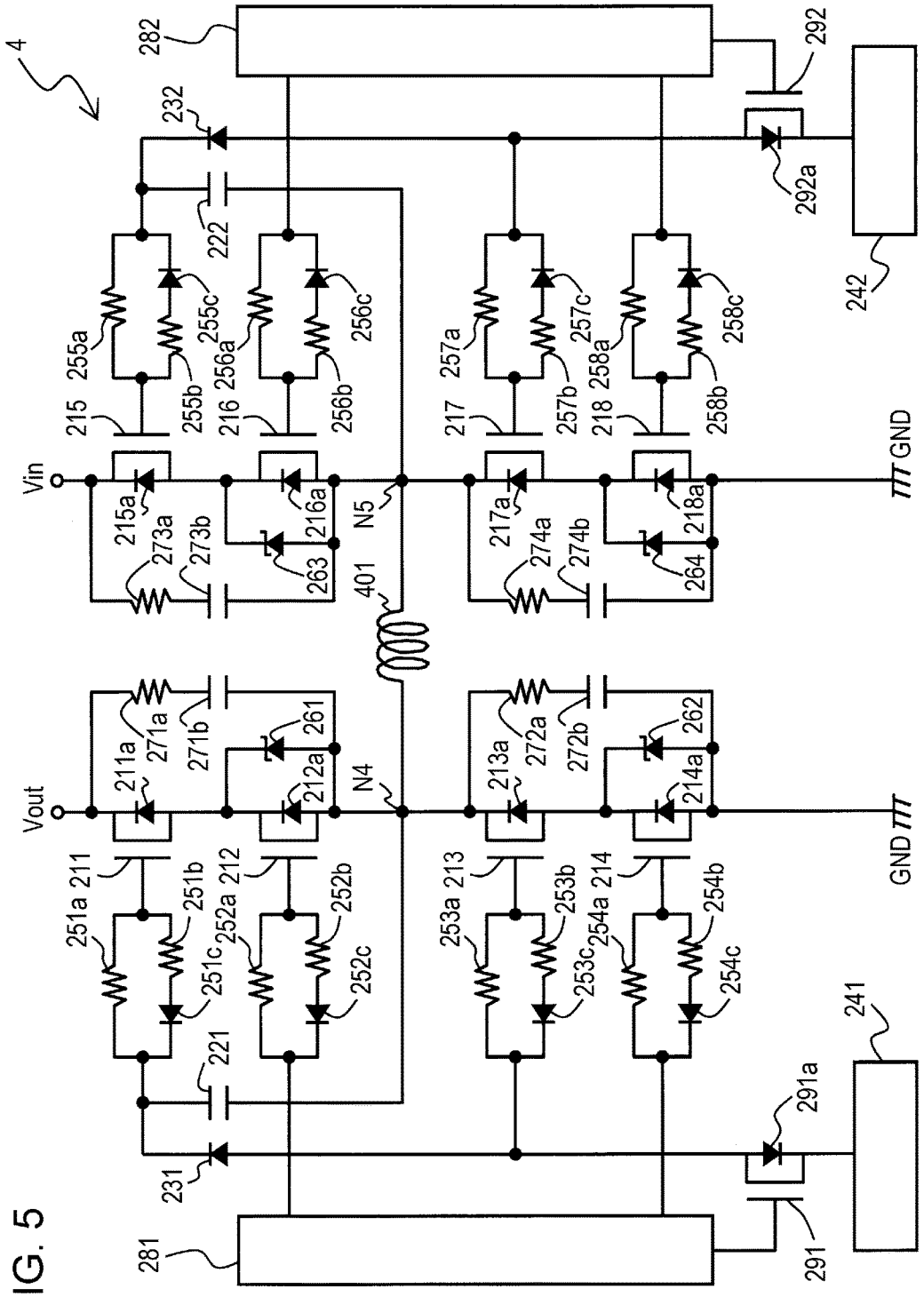
FIG. 5 is a circuit block diagram illustrating a configuration of a step-up chopper according to a third preferred embodiment of the present invention.

FIG. 5 illustrates a step-up chopper 4 according to a third preferred embodiment of the present invention. The step-up chopper 4 includes a circuit that is similar to the inverter 2. The step-up chopper 4 and the inverter 2 are different only in that the upper-left and lower-left arms and the upper-right and lower-right arms are joined by a coil 401 which is part of the step-up chopper 4, the drain of the transistor 215 of the upper-right arm is connected to an input terminal Vin, and the drain of the transistor 211 of the upper-left arm is connected to an output terminal Vout. Note that description will be reduced or omitted for elements having the same reference numerals as the inverter 2.

Operation of the step-up chopper will be described. When the transistors 214 and 216 are turned on, current flows from the input terminal Vin, through the transistors 215 and 216, the coil 401, and the transistors 213 and 214, to the ground voltage GND line, and electromagnetic energy is accumulated in the coil 401.

At this point, in the upper-right arm, current is flowing from the input terminal Vin to the output node N5 (the downward direction in FIG. 5), and the transistor 215 and the transistor 216 are both turned on. In addition, in the lower-left arm, current is flowing from the output node N4 to the ground voltage GND line, and the transistor 213 and the transistor 214 are both turned on.

Next, if the transistor 214 is turned off, current stops flowing to the transistor 214, but the coil 401 continues to allow the flow of current, the source voltage of the transistor 213 rises, and the transistor 213 is also turned off. Since the coil 401 continues to allow the flow of current even after the transistors 213 and 214 turn off, the source voltage of the transistor 212 rises. When the source voltage of the transistor 212 becomes higher than the drain voltage, reflux current flows from the source of the transistor 212, through the parasitic diode 212a, to the drain of the transistor 212.

At this point, the source voltage of the transistor 211 has become lower than the source voltage of the transistor 212. In addition, the gate voltage of the transistor 211 is kept at a voltage higher than the source voltage of the transistor 212 by the voltage produced by the gate power supply 241 (10 V, for example) due to the capacitive coupling of the capacitor 221, and thus the transistor 211 is turned on. For this reason, current flows to the channel of the transistor 211, and the current flowing to the parasitic diode 211a is kept small.

At this point, current flows from the input terminal Vin, through the transistors 215 and 216, the coil 401, the parasitic diode 212a, and the transistor 211, to the output terminal Vout, and the electromagnetic energy in the coil 401 is released.

At this point, in the upper-right arm, current is flowing from the input terminal Vin to the output node N5 (the downward direction in FIG. 5), and the transistor 215 and the transistor 216 are both turned on. In addition, in the upper-left arm, current is flowing from the output node N4 to the output terminal Vout (the upward direction in FIG. 5), the transistor 211 is turned on, and the transistor 212 is turned off.

Next, if the transistor 214 is turned on, current flows to the transistor 214, the source voltage of the transistor 213 lowers, and the transistor 213 also turns on. Consequently, the transistors 213 and 214 are on, the current in the coil 401 starts flowing to the transistors 213 and 214, and the source voltage of the transistor 212 lowers. If the source voltage of the transistor 212 goes lower than the drain voltage, a recovery current flows through the transistor 212, and at the same time or afterwards, a recovery current flows through the transistor 211. After that, when the source voltage of the transistor 212 lowers sufficiently, current flows from the input terminal Vin, through the transistors 215 and 216, the coil 401, and the transistors 213 and 214, to the ground voltage GND line, and electromagnetic energy is accumulated in the coil 401. In this way, if the transistor 214 is turned on and off with a 50% duty cycle, in the present example, the output voltage of the step-up chopper becomes approximately 300 V with respect to an input voltage of 150 V.

With regard to the switching speed as the transistor 214 is turned on and off, it is possible to decide independently the rising speed and the falling speed of switching when both turning on and when turning off the transistor 214 by appropriately selecting the resistors 253a, 253b, 254a, and 254b, in a manner similar to that described above with respect to the first preferred embodiment of the present invention.

Since the step-up chopper according to the third preferred embodiment includes the switching power supply device according to the first preferred embodiment, a highly efficient and low-cost step-up chopper is provided.

Note that although the third preferred embodiment describes a step-up chopper (non-isolated DC-DC converter) including arms that include a high withstand voltage transistor and a low withstand voltage transistor connected in series, it is possible to provide another switching power supply device using such arms. Other switching power supply devices include an isolated DC-DC converter, a power factor correction (PFC) circuit, and the like.

Fourth Preferred Embodiment

Figure 6:
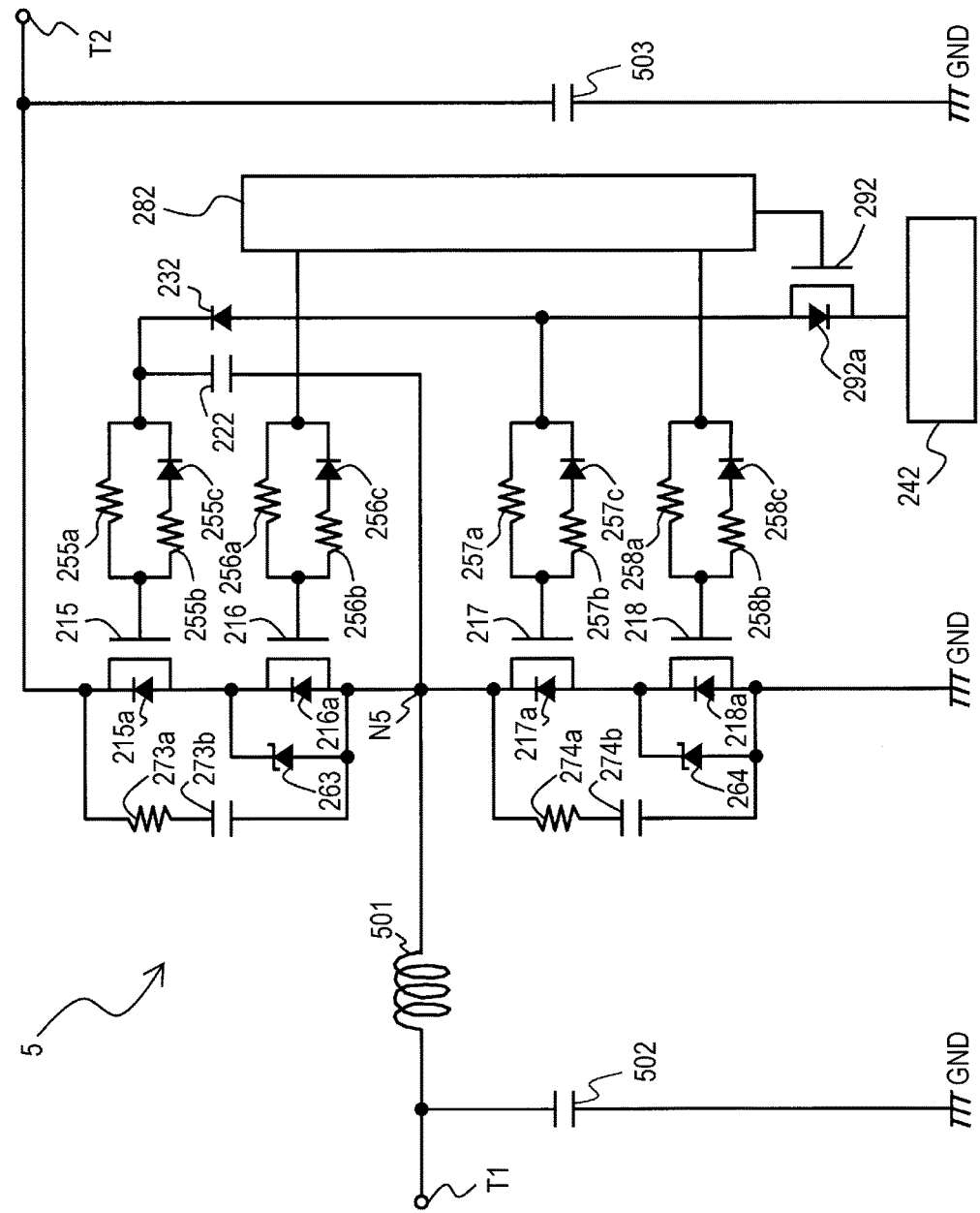
FIG. 6 is a circuit block diagram illustrating a configuration of a bidirectional chopper according to a fourth preferred embodiment of the present invention.

FIG. 6 is a circuit block diagram illustrating a configuration of a bidirectional chopper 5 according to a fourth preferred embodiment of the present invention, in comparison to FIG. 5. In FIG. 6, the bidirectional chopper 5 includes the transistors 215 to 218 and 292, the capacitors 222, 273b, and 274b, the diodes 232 and 255c to 258c, the resistors 255a to 258a, 255b to 258b, 273a, and 274a, the Zener diodes 263 and 264, the gate power supply 242, and the gate driver 282 from the step-up chopper 4 of FIG. 5. The bidirectional chopper 5 is additionally including a coil 501 whose first terminal is connected to the output node N5, a capacitor 502 provided between the other terminal of the coil 501 and the ground voltage GND line, a first input/output terminal T1 connected to the other terminal of the coil 501, and a second input/output terminal T2 connected to a capacitor 503 provided between the drain of the transistor 215 and the ground voltage GND line, and the drain of the transistor 215. Note that description will be reduced or omitted for elements having the same reference numerals as the step-up chopper 4 of FIG. 5.

Next, the step-up operation of the bidirectional chopper will be described. In the case of applying 140 V, for example, to a first input/output terminal T1 and outputting 280 V to a second input/output terminal T2, a DC voltage (10 V, for example) that is higher than a threshold voltage VTH of the high withstand voltage transistors is applied to the gate of each of high withstand voltage transistors 215 and 217. In addition, a low withstand voltage transistor 216 is turned off, and a low withstand voltage transistor 218 is turned on and off with a duty cycle (50%, for example) corresponding to the step-up ratio (×2).

When the transistor 218 turns on, a current flows from the first input/output terminal T1, through the coil 501 and the transistors 217 and 218, to a ground voltage GND line, and electromagnetic energy is accumulated in the coil 501. Next, when the transistor 218 turns off, current flows back from the coil 501, through a parasitic diode 216a and the transistor 215, to the second input/output terminal T2, and the voltage of the second input/output terminal T2 is raised. The voltage of the second input/output terminal T2 becomes 280 V, which is higher than the voltage of the first input/output terminal T1 (140 V).

If the transistor 218 is turned on while current is flowing back from the coil 501, through the parasitic diode 216a and the transistor 215, to the second input/output terminal T2, a recovery current flows through the parasitic diode 216a of the low withstand voltage transistor 216. However, the recovery current of the low withstand voltage transistor 216 is smaller than the recovery current of the high withstand voltage transistors. Also, since almost no reflux current flows through the parasitic diode 215a of the high withstand voltage transistor 215, the recovery current of the high withstand voltage transistor 215 is also small. Consequently, the recovery current during the step-up operation is kept small.

Next, the step-down operation of the bidirectional chopper will be described. In the case of applying 280 V, for example, to the second input/output terminal T2 and outputting 140 V to the first input/output terminal T1, a DC voltage (10 V, for example) that is higher than the threshold voltage VTH of the high withstand voltage transistors is applied to the gate of each of high withstand voltage transistors 215 and 217. In addition, the low withstand voltage transistor 218 is turned off, and the low withstand voltage transistor 216 is turned on and off with a duty cycle (50%, for example) corresponding to the step-down ratio (×2).

When the transistor 216 turns on, a current flows from the second input/output terminal T2, through the transistors 215 and 216 and the coil 501, to the first input/output terminal T1, and electromagnetic energy is accumulated in the coil 501. Next, when the transistor 216 turns off, current flows back from the ground voltage GND line, through the parasitic diode 218a, the transistor 217, and the coil 501, to the first input/output terminal T1, and the voltage of the first input/output terminal T1 is lowered. The voltage of the first input/output terminal T1 becomes 140 V, which is lower than the voltage of the second input/output terminal T2 (280 V).

If the transistor 216 is turned on while current is flowing back from the ground voltage GND line, through the parasitic diode 218a, the transistor 217, and the coil 501, to the first input/output terminal T1, a recovery current flows through the parasitic diode 218a of the low withstand voltage transistor 218. However, the recovery current of the low withstand voltage transistor 218 is smaller than the recovery current of the high withstand voltage transistors. Also, since almost no reflux current flows through the parasitic diode 217a of the high withstand voltage transistor 217, the recovery current of the high withstand voltage transistor 217 is also small. Consequently, the recovery current during the step-down operation is kept small.

Note that although the low withstand voltage transistor 216 (or 218) is not switched and is kept off to make a current flow through the parasitic diode 216a (or 218a), but the configuration is not limited thereto, and synchronous rectification is also conducted. With synchronous rectification, when current starts to flow through the parasitic diode 216a (or 218a), the low withstand voltage transistor 216 (or 218) is turned on, and immediately before the low withstand voltage transistor 218 (or 216) being switched is turned on, or in other words, immediately before current ceases to flow through the low withstand voltage transistor 216 (or 218), the low withstand voltage transistor 216 (or 218) is turned off. Consequently, power losses are significantly reduced or prevented further.

With regard to the switching speed as the transistor 216 or 218 is turned on and off, it is possible to decide independently the rising speed and the falling speed of switching when both turning on and when turning off the transistor 216 or 218 by appropriately selecting the resistors 255a, 255b, 256a, and 256b, or the resistors 257a, 257b, 258a, and 258b.

Since the bidirectional chopper according to the fourth preferred embodiment includes the switching power supply device according to the first preferred embodiment, a highly efficient and low-cost bidirectional chopper is provided.

Note that although the fourth preferred embodiment describes a bidirectional chopper including arms that include a high withstand voltage transistor and a low withstand voltage transistor connected in series, it is possible to provide a unidirectional chopper using such arms.

Fifth Preferred Embodiment

Figure 7:
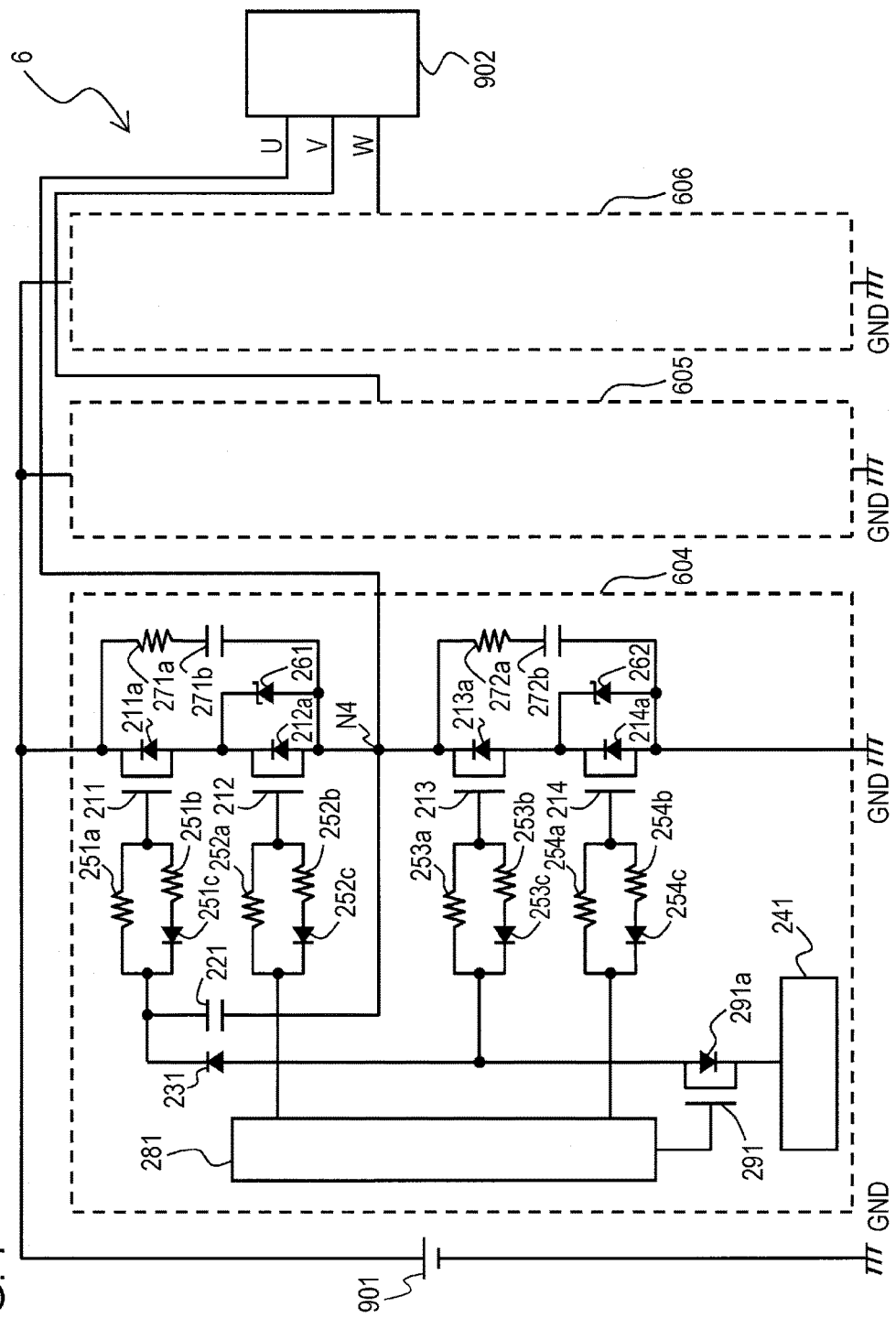
FIG. 7 is a circuit block diagram illustrating a configuration of a three-phase motor control inverter according to a fifth preferred embodiment of the present invention.

FIG. 7 is a circuit block diagram illustrating a configuration of a three-phase motor control inverter 6 according to a fifth preferred embodiment of the present invention. In FIG. 7, the three-phase motor control inverter 6 includes a U-phase driver 604, a V-phase driver 605, and a W-phase driver 606.

The U-phase driver 604 includes the transistors 211 to 214 and 291, the capacitors 221, 271b, and 272b, the diodes 231 and 251c to 254c, the resistors 251a to 254a, 251b to 254b, 271a, and 272a, the Zener diodes 261 and 262, the gate power supply 241, and the gate driver 281 from the inverter illustrated in FIG. 2. The drain of the transistor 211 of the U-phase driver 604 is connected to a DC power supply 901. The output node N4 of the U-phase driver 604 is connected to a U-phase terminal (a terminal on a first end of a U-phase coil) of a motor 902. Note that description will be reduced or omitted for elements having the same reference numerals as the inverter 2 in FIG. 2.

The V-phase driver 605 is the same as the U-phase driver 604. The drain of the transistor 211 of the V-phase driver 605 is connected to the DC power supply 901. The output node N4 of the V-phase driver 605 is connected to a V-phase terminal (a terminal on a first end of a V-phase coil) of the motor 902.

The W-phase driver 606 is the same as the U-phase driver 604. The drain of the transistor 211 of the W-phase driver 606 is connected to the DC power supply 901. The output node N4 of the W-phase driver 606 is connected to a W-phase terminal (a terminal on a first end of a W-phase coil) of the motor 902. The terminals on the other ends of the U-phase coil, the V-phase coil, and the W-phase coil of the motor 902 are connected to each other.

The inverter supplies power to the motor 902 using what is called the 120° conduction mode to rotationally drive a rotor of the motor 902. With the 120° conduction mode, the upper arms (transistors 211 and 212) of the U-phase driver 604, the V-phase driver 605, and the W-phase driver 606 are successively turned on every 120°, while in addition, the lower arms (transistors 213 and 214) of the U-phase driver 604, the V-phase driver 605, and the W-phase driver 606 are successively turned on every 120° after a 180° delay with respect to the upper arms. Consequently, three-phase AC power is supplied to the motor 902, and the rotor of the motor 902 is rotationally driven.

Next, a case of current flowing from the DC power supply 901, through the upper arm of the U-phase driver 604, the motor 902, and the lower arm of the V-phase driver 605, to the ground voltage GND line will be described. In this case, a voltage (10 V, for example) that is higher than the threshold voltage of the high withstand voltage transistors 211 and 213 is applied to the gates of the high withstand voltage transistors 211 and 213 of the drivers 604 and 605. In addition, the low withstand voltage transistor 214 of the U-phase driver 604 is turned off, the low withstand voltage transistor 212 of the V-phase driver 605 is turned off, and the low withstand voltage transistor 214 of the V-phase driver 605 is turned on. In this state, the low withstand voltage transistor 212 of the U-phase driver 604 is turned on and off.

If the low withstand voltage transistor 212 of the U-phase driver 604 is turned on, current flows from the DC power supply 901, through the transistors 211 and 212 of the U-phase driver 604, the U-phase coil and the V-phase coil of the motor 902, and the transistors 213 and 214 of the V-phase driver 605, to the ground voltage GND line.

Next, if the low withstand voltage transistor 212 of the U-phase driver 604 is turned off, the U-phase coil and the V-phase coil of the motor attempt to continue passing current. For this reason, a reflux current flows from the ground voltage GND line, through the parasitic diode 214a and the high withstand voltage transistor 213 of the U-phase driver 604, the motor 902, and the transistors 213 and 214 of the V-phase driver 605, to the ground voltage GND line.

By similarly controlling the three drivers 604 to 606, a sinusoidal current is able to be supplied to the motor 902.

With regard to the switching speed as the transistor 212 is turned on and off, it is possible to decide independently the rising speed and the falling speed of switching when both turning on and when turning off the transistor 212 by appropriately selecting the resistors 251a, 251b, 252a, and 252b.

Since a three-phase motor control inverter according to the fifth preferred embodiment includes the switching power supply device according to the first preferred embodiment, a highly efficient and low-cost three-phase motor control inverter is provided.

Sixth Preferred Embodiment

Figure 8:
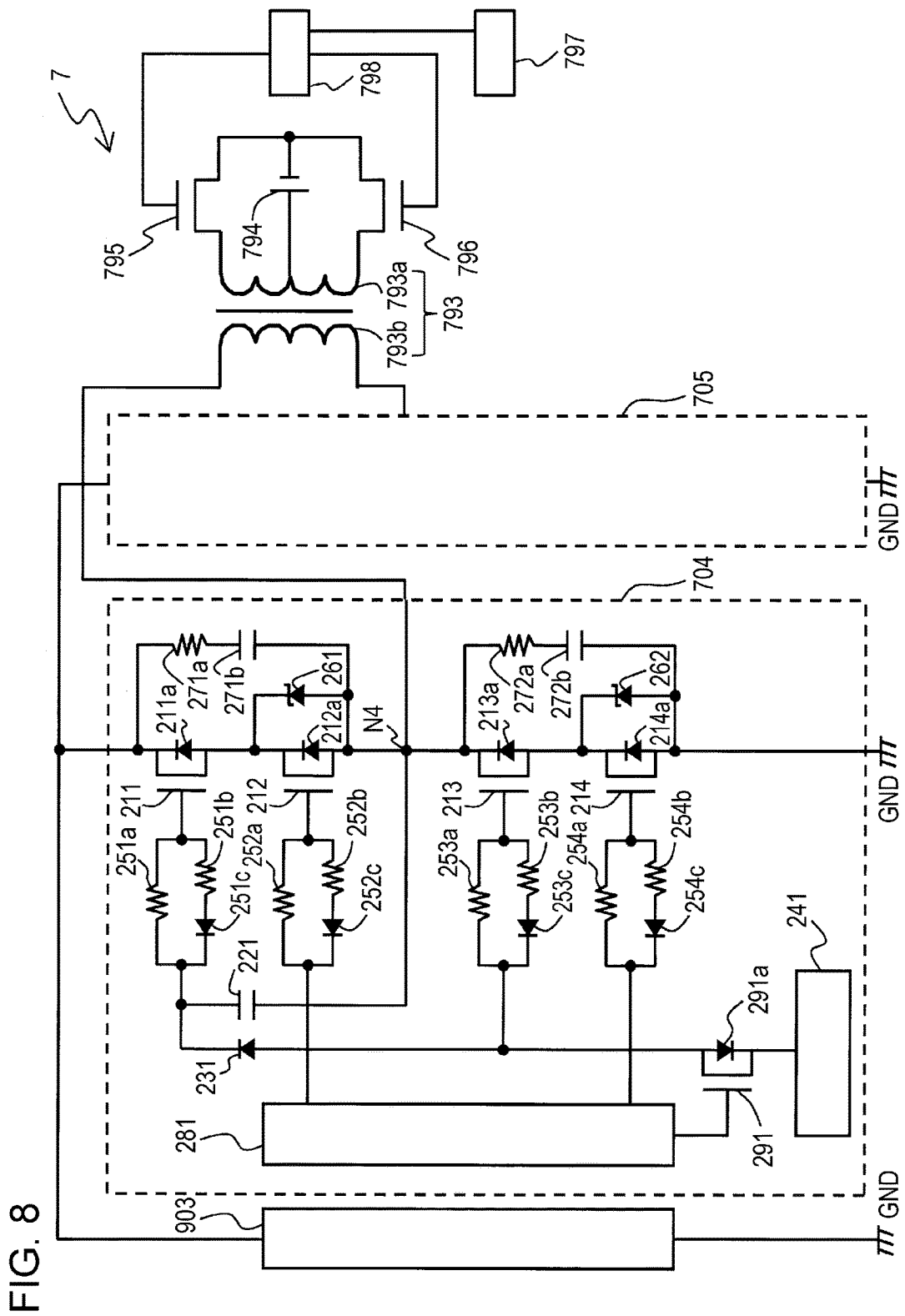
FIG. 8 is a circuit block diagram illustrating a configuration of a push-pull DC/DC converter according to a sixth preferred embodiment of the present invention.

FIG. 8 is a circuit block diagram illustrating a configuration of a push-pull DC/DC converter 7 according to a sixth preferred embodiment of the present invention. In FIG. 8, a push-pull DC/DC converter 7 includes a gate power supply 797, a gate driver 798, a DC power supply 794, re-channel MOS transistors 795 and 796, a transformer 793, and drivers 704 and 705. A load 903 is connected to the drivers 704 and 705.

The gate power supply 797 outputs a gate voltage. The transformer 793 includes a primary winding 793a and a secondary winding 793b. A positive pole of the DC power supply 794 is connected at a midpoint of a primary winding 793a. The transistor 795 is connected between a first terminal of the primary winding 793a and a negative pole of the DC power supply 794. The transistor 796 is connected between the other terminal of the primary winding 793a and the negative pole of the DC power supply 794. The gates of the transistors 795 and 796 are connected to the gate driver 798. The gate driver 798 alternately applies the gate voltage from the gate power supply 797 to the gates of the transistors 795 and 796. Consequently, the transistors 795 and 796 turn on in alternation, producing an AC voltage in a secondary winding 793b of the transformer 793.

The driver 704 includes the transistors 211 to 214 and 291, the capacitors 221, 271b, and 272b, the diodes 231 and 251c to 254c, the resistors 251a to 254a, 251b to 254b, 271a, and 272a, the Zener diodes 261 and 262, the gate power supply 241, and the gate driver 281 from the inverter illustrated in FIG. 2. The drain of the transistor 211 of the driver 704 is connected to a first end of the load 903. The output node N4 of the driver 704 is connected to a terminal on a first end of the secondary winding 793b of the transformer 793. Note that description will be reduced or omitted for elements having the same reference numerals as the inverter 2 in FIG. 2.

The driver 705 is the same as the driver 704. The drain of the transistor 211 of the driver 705 is connected to a first end of the load 903. The output node N4 of the driver 705 is connected to a terminal on the other end of the secondary winding 793b of the transformer 793.

Next, operation of the push-pull DC/DC converter 7 will be described. A voltage (10 V, for example) that is higher than a threshold voltage VTH of the high withstand voltage transistor is applied to the gate of each of the high withstand voltage transistors 211 and 213 of the drivers 704 and 705. In addition, the low withstand voltage transistors 212 and 214 of the drivers 704 and 705 are turned off, and the transistors 795 and 796 are turned on in alternation.

If the transistor 795 is turned on while the transistor 796 is off, current flows from the DC power supply 794 to the primary winding 793a of the transformer 793 and the transistor 795, and a positive voltage is induced in the secondary winding 793b of the transformer 793. Consequently, current flows from the ground voltage GND line, through the parasitic diode 214a and the high withstand voltage transistor 213 of the driver 705, the secondary winding 793b, the parasitic diode 212a and the high withstand voltage transistor 211 of the driver 704, and the load 903, to the ground voltage GND line. A voltage having a value corresponding to the winding turns ratio of the transformer 793 is applied to the load 903.

Next, if the transistor 795 is turned off, the current flowing from the DC power supply 794 to the primary winding 793a of the transformer 793 is cut off, and the current flowing through the secondary winding 793b is also cut off. At this point, an electrical charge flowing through the parasitic diode 214a of the driver 705 and the parasitic diode 212a of the driver 704, as well as the electrical charge accumulated in the parasitic capacitor of the circuit, flows as a recovery current.

Subsequently, if the transistor 796 is turned on while the transistor 795 is off, current flows from the DC power supply 794 to the primary winding 793a of the transformer 793 and the transistor 795, and a negative voltage is induced in the secondary winding 793b of the transformer 793. Consequently, current flows from the ground voltage GND line, through the parasitic diode 214a and the high withstand voltage transistor 213 of the driver 704, the secondary winding 793b, the parasitic diode 212a and the high withstand voltage transistor 211 of the driver 705, and the load 903, to the ground voltage GND line. A voltage having a value corresponding to the winding turns ratio of the transformer 793 is applied to the load 903.

Next, if the transistor 796 is turned off, the current flowing from the DC power supply 794 to the primary winding 793a of the transformer 793 is cut off, and the current flowing through the secondary winding 793b is also cut off. At this point, the electrical charge flowing through the parasitic diode 214a of the driver 704 and the parasitic diode 212a of the driver 705, as well as the electrical charge accumulated in the parasitic capacitor of the circuit, flows as a recovery current.

Since the push-pull DC/DC converter according to the sixth preferred embodiment includes the switching power supply device according to the first preferred embodiment, a highly efficient and low-cost push-pull DC/DC converter is provided.

Note that the switching power supply device (inverter, converter) according to the second to sixth preferred embodiment s above using the switching power supply device according to the first preferred embodiment above is usable in a refrigerator, a freezer, an air conditioner, a solar power controller, an automobile, and the like. By using the switching power supply device (inverter, converter) according to the second to sixth preferred embodiments above in a refrigerator, a freezer, an air conditioner, a solar power controller, an automobile, and the like, it is possible to increase the efficiency of the refrigerator, the freezer, the air conditioner, the solar power controller, the automobile, and the like.

The preferred embodiments disclosed herein are for illustrative purposes in all points, and should be considered to be non-limiting. The scope of the present invention is indicated by the claims rather than the foregoing description, and all modifications within the scope of the claims and their equivalents are to be included in the scope of the present invention.

A switching power supply device according to a preferred embodiment of the present invention includes: a first transistor including a first electrode connected to a first node; and a second transistor including a first electrode connected to a second electrode of the first transistor, and a second electrode connected to a second node, wherein each of the first and second transistors includes a parasitic diode connected in a forward direction between the second and first electrodes, and a withstand voltage between the first and second electrodes of the first transistor is higher than a withstand voltage between the first and second electrodes of the second transistor.

In addition, a switching power supply device according to a preferred embodiment of the present invention includes a driving circuit that turns on the first and second transistors when a current flows from the first node to the second node, and turns on the first transistor while also turning off the second transistor when a current flows from the second node to the first node, wherein the driving circuit turns on the first transistor by applying to a control electrode of the first transistor a voltage that is higher than a voltage obtained by adding a threshold voltage of the first transistor to a voltage of the second node, a first delay circuit that delays a potential variation of the control electrode of the first transistor and a second delay circuit that delays a potential variation of a control electrode of the second transistor are connected to the control electrode of the first transistor and the control electrode of the second transistor, respectively, and at least one of the first delay circuit and the second delay circuit includes a structure that causes the potential of the control electrode of the first transistor or the control electrode of the second transistor to be increased and decreased at different speeds.

According to a preferred embodiment of the present invention, a second transistor having a low withstand voltage compared to a first transistor having a high withstand voltage has a small recovery current caused by a built-in diode. Subsequently, when current flows from the second node to the first node, the first transistor turns on and the second transistor turns off, and thus a current flows only to the built-in diode of the second transistor having a small recovery current, without a current flowing to the built-in diode of the first transistor having a large recovery current. Consequently, the built-in diodes of the transistors preferably are utilized without externally attaching a freewheeling diode, and losses due to recovery current are significantly reduced or prevented. As a result, a highly efficient and low-cost switching power supply device is provided.

Also, according to a preferred embodiment of the present invention, the first transistor having a high withstand voltage and the second transistor having a low withstand voltage are connected in series, and the second transistor having a low withstand voltage performs a switching operation. Since a majority of a power supply voltage is applied between a first electrode and a second electrode of the first transistor having a high withstand voltage, a voltage between the first electrode and the second electrode of the second transistor having a low withstand voltage that performs the switching operation is able to be small. For this reason, a degree of influence on an electric potential of a control electrode of the second transistor that performs the switching operation exerted due to variation in the electric potential of a capacitively coupled first electrode is able to be small. As a result, misfiring of the second transistor due to variation in the electric potential of the control electrode is effectively. Consequently, a highly reliable switching power supply device is provided.

Also, according to a preferred embodiment of the present invention, in at least one of either the first or the second transistor, it is possible to decide independently the speeds at which the electric potential of the control electrode increases and decreases. Consequently, since the rising and falling speeds of switching is able to be decided independently, more precise switching of the circuit is able to be sped up within a range in which the circuit does not oscillate, and losses are significantly reduced or eliminated.

In one preferred embodiment, the first delay circuit or the second delay circuit includes a structure that causes potential of the control electrode of the first transistor or the control electrode of the second transistor to be increased and decreased at different speeds features a first resistor connected in parallel with a circuit in which a second resistor and a diode are connected in series.

According to the above preferred embodiment, the first or second delay circuit includes a simple circuit enabling the potential of the control electrode of the first transistor or the transistor to be increased and decreased at different speeds, and thus a cost of the switching power supply device is reduced.

Also, in one preferred embodiment, the first delay circuit and the second delay circuit include a structure that causes the potential of each of the control electrode of the first transistor and the control electrode of the second transistor to be increased and decreased at different speeds.

According to the above preferred embodiment, it is possible to decide independently each of the speeds at which the potential of the control electrode of each of the first and second transistors is increased and decreased, precise switching of the circuit is able to be sped up, and losses are significantly reduced or prevented to the utmost limit.

Also, in one preferred embodiment, the driving circuit includes a structure so that when a current flows from the first node to the second node, respectively different potentials are applied to the control electrode of the first transistor and the control electrode of the second transistor.

According to the above preferred embodiment, a cost reduction or a reliability improvement is realized, and moreover, a switching power supply device having good performance is realized.

Also, in one preferred embodiment, the driving circuit includes a structure so that when a current flows from the first node to the second node, a gate overdrive to apply to the control electrode of the first transistor is made smaller than a gate overdrive to apply to the control electrode of the second transistor.

According to the above preferred embodiment, the voltage between the first and second electrodes of the second transistor is able to be kept small while still keeping a small on-resistance in the second transistor having a low withstand voltage. Consequently, reliability is improved while retaining the performance of the switching power supply device.

In addition, a switching power supply device according to a preferred embodiment of the present invention includes: a first transistor including a first electrode connected to a first node; and a second transistor including a first electrode connected to a second electrode of the first transistor, and a second electrode connected to a second node, wherein each of the first and second transistors includes a parasitic diode connected in a forward direction between the second and first electrodes, and a withstand voltage between the first and second electrodes of the first transistor is higher than a withstand voltage between the first and second electrodes of the second transistor. In addition, a switching power supply device according to a preferred embodiment of the present invention includes: a driving circuit that, when a current flows from the first node to the second node, turns on the first and second transistors, and when a current flows from the second node to the first node, turns on the second transistor after current starts to flow from the second node to the first node, and turns off the second transistor before current stops flowing from the second node to the first node, wherein the driving circuit turns on the first transistor by applying to a control electrode of the first transistor a voltage that is higher than the voltage obtained by adding a threshold voltage of the first transistor to the voltage of the second node, a first delay circuit that delays the potential variation of the control electrode of the first transistor and a second delay circuit that delays the potential variation of the control electrode of the second transistor are connected to the control electrode of the first transistor and the control electrode of the second transistor, respectively, and at least one of the first delay circuit and the second delay circuit includes a structure that causes the potential of the control electrode of the first transistor or the control electrode of the second transistor to be increased and decreased at different speeds.

According to a preferred embodiment of the present invention, an efficiency of the switching power supply device is improved further.

In addition, a switching power supply device according to a preferred embodiment of the present invention includes: a first transistor including a first electrode connected to a power supply voltage line; a second transistor including a first electrode connected to a second electrode of the first transistor, and a second electrode connected to an output node; a third transistor including a first electrode connected to the output node; and a fourth transistor including a first electrode connected to a second electrode of the third transistor, and a second electrode connected to a reference voltage line, wherein each of the first to fourth transistors includes a parasitic diode connected in the forward direction between the second and first electrodes, the withstand voltage between the first and second electrodes of the first transistor is higher than the withstand voltage between the first and second electrodes of the second transistor, and the withstand voltage between the first and second electrodes of the third transistor is higher than the withstand voltage between the first and second electrodes of the fourth transistor. In addition, a switching power supply device according to a preferred embodiment of the present invention includes: a driving circuit that turns on the first and second transistors when current flows from the power supply voltage line to the output node, turns on the first transistor and turns off the second transistor when current flows from the output node to the power supply voltage line, turns on the third and fourth transistors when current flows from the output node to the reference voltage line, and turns on the third transistor and turns off the fourth transistor when current flows from the reference voltage line to the output node, wherein the driving circuit turns on the first transistor by applying to a control electrode of the first transistor a voltage that is higher than the voltage obtained by adding a threshold voltage of the first transistor to the voltage of the output node. Additionally, the driving circuit turns on the third transistor by applying to a control electrode of the third transistor a voltage that is higher than a voltage obtained by adding a threshold voltage of the third transistor to the voltage of the reference voltage line. First, second, third, and fourth delay circuits that delay the potential variation of the control electrode of each of the first, second, third, and fourth transistors, respectively, are connected to the control electrode of each of the first, second, third, and fourth transistors. At least one of the first delay circuit and the second delay circuit includes a structure that causes the potential of the control electrode of the first transistor or the control electrode of the second transistor to be increased and decreased at different speeds, and at least one of the third delay circuit and the fourth delay circuit includes a structure that causes the potential of the control electrode of the third transistor or the control electrode of the fourth transistor to be increased and decreased at different speeds.

According to a preferred embodiment of the present invention, a highly efficient, highly reliable, and low-cost switching power supply device is provided.

Also, a converter according to a preferred embodiment of the present invention includes the switching power supply device of the present invention, and steps up or steps down a DC voltage.

According to a preferred embodiment of the present invention, a highly efficient, highly reliable, and low-cost converter is provided.

Also, an inverter according to a preferred embodiment of the present invention includes the switching power supply device of the present invention, and converts DC power to AC power.

According to a preferred embodiment of the present invention, a highly efficient, highly reliable, and low-cost inverter is provided.

Also, an air conditioner according to a preferred embodiment of the present invention includes the switching power supply device of the present invention.

According to a preferred embodiment of the present invention, a highly efficient, highly reliable, and low-cost air conditioner is provided.

Also, a solar power controller according to a preferred embodiment of the present invention includes the switching power supply device of the present invention.

According to a preferred embodiment of the present invention, a highly efficient, highly reliable, and low-cost solar power controller is provided.

Also, an automobile according to a preferred embodiment of the present invention includes the switching power supply device of the present invention.

According to a preferred embodiment of the present invention, a highly efficient, highly reliable, and low-cost automobile is provided.

Various preferred embodiments of the present invention may be applied to a switching power supply device, and more particularly, may be applied to a switching power supply device with low switching loss, and to an inverter, a converter, and a solar power controller including the same.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. A switching power supply device comprising:
a first transistor including a first electrode connected to a first node;
a second transistor including a first electrode connected to a second electrode of the first transistor, and a second electrode connected to a second node;
a driving circuit that turns on the first and second transistors when a current flows from the first node to the second node, and turns on the first transistor while also turning off the second transistor when a current flows from the second node to the first node;
a first delay circuit, connected between a control electrode of the first transistor and the driving circuit, that delays a potential variation of the control electrode of the first transistor; and
a second delay circuit, connected between a control electrode of the second transistor and the driving circuit, that delays a potential variation of the control electrode of the second transistor, wherein
each of the first and second transistors includes a parasitic diode connected in a forward direction between the second and first electrodes;
a withstand voltage between the first and second electrodes of the first transistor is higher than a withstand voltage between the first and second electrodes of the second transistor,
the driving circuit turns on the first transistor by applying to the control electrode of the first transistor a voltage that is higher than a voltage obtained by adding a threshold voltage of the first transistor to a voltage of the second node; and
at least one of the first delay circuit and the second delay circuit includes a structure that causes a potential of the control electrode of the first transistor or the control electrode of the second transistor to be increased and decreased at different speeds.

2. A converter that steps up or steps down a DC voltage, comprising:
a switching power supply device according to claim 1.

3. An inverter that converts DC power to AC power, comprising:
the switching power supply device according to claim 1.

4. A solar power controller, comprising:
the switching power supply device according to claim 1.

5. The switching power supply device according to claim 1, wherein
the first delay circuit or the second delay circuit includes:
a circuit that includes:
a first resistor; and
a second resistor and a diode connected to each other in series, which are connected in parallel to the first resistor.

6. A converter that steps up or steps down a DC voltage, comprising:
a switching power supply device according to claim 5.

7. An inverter that converts DC power to AC power, comprising:
the switching power supply device according to claim 5.

8. A solar power controller, comprising:
the switching power supply device according to claim 5.

* * * * *